United States Patent [19]
Balamuth et al.
[11] 4,012,647
[45] Mar. 15, 1977

[54] ULTRASONIC MOTORS AND CONVERTERS

[75] Inventors: Lewis Balamuth, Southampton; Arthur Kuris, Riverdale; Manuel Karatjas, Glen Oaks, all of N.Y.

[73] Assignee: Ultrasonic Systems, Inc., Farmingdale, N.Y.

[22] Filed: Aug. 1, 1975

[21] Appl. No.: 601,046

Related U.S. Application Data

[63] Continuation of Ser. No. 426,822, Jan. 31, 1974, abandoned.

[52] U.S. Cl. .................. 310/8.1; 318/118
[51] Int. Cl.² .................. H01L 41/08
[58] Field of Search .............. 310/8.1, 8.3, 8.7, 26; 318/116, 118

[56] References Cited

UNITED STATES PATENTS

| | | | |
|---|---|---|---|
| 2,848,672 | 8/1958 | Harris | 318/118 |
| 3,368,280 | 2/1968 | Friedman et al. | 310/26 X |
| 3,375,820 | 4/1968 | Kuris et al. | 310/26 X |
| 3,432,691 | 3/1969 | Shoh | 310/8.1 |
| 3,651,352 | 3/1972 | Puskas | 310/8.1 |
| 3,681,627 | 8/1972 | Murry et al. | 310/8.1 X |
| 3,727,112 | 4/1973 | Popescu | 310/8.1 X |
| 3,819,961 | 6/1974 | Bourgeois et al. | 310/8.1 |
| 3,889,166 | 6/1975 | Scurlock | 310/8.1 X |
| 3,931,533 | 1/1976 | Raso et al. | 310/8.1 |

*Primary Examiner*—Mark O. Budd

[57] ABSTRACT

The invention discloses various embodiments of an ultrasonic motor and converter adapted to be used in home or industrial ultrasonic devices. The ultrasonic motor is generally of a piezoelectric material having a removable tip or of a design in which the complete motor is contained in a housing, which housing has electrical contact means adapted to be plugged into an adapter which, in turn, is connected to a converter. The motor is designed such that frequency sensing means is provided therein and the feedback signal is utilized by the converter to adjust itself thereto. The converter includes tuned circuit means tuned to a band including a desired frequency for sustaining the vibration of said motor at the desired frequency.

38 Claims, 33 Drawing Figures

FIG. 7
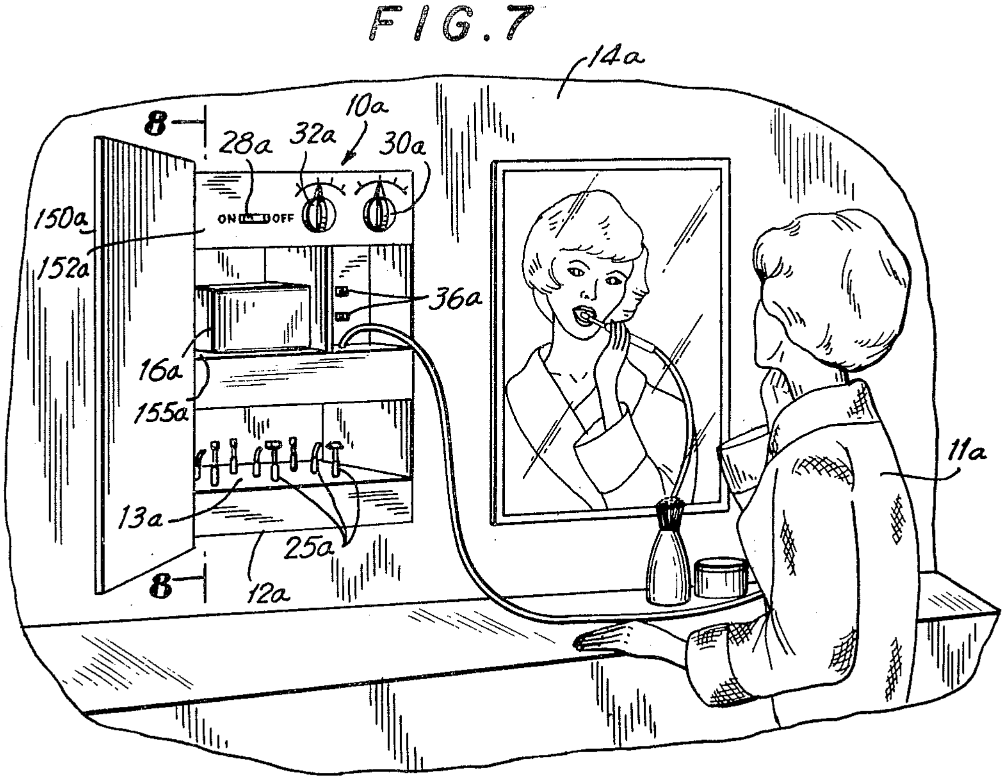
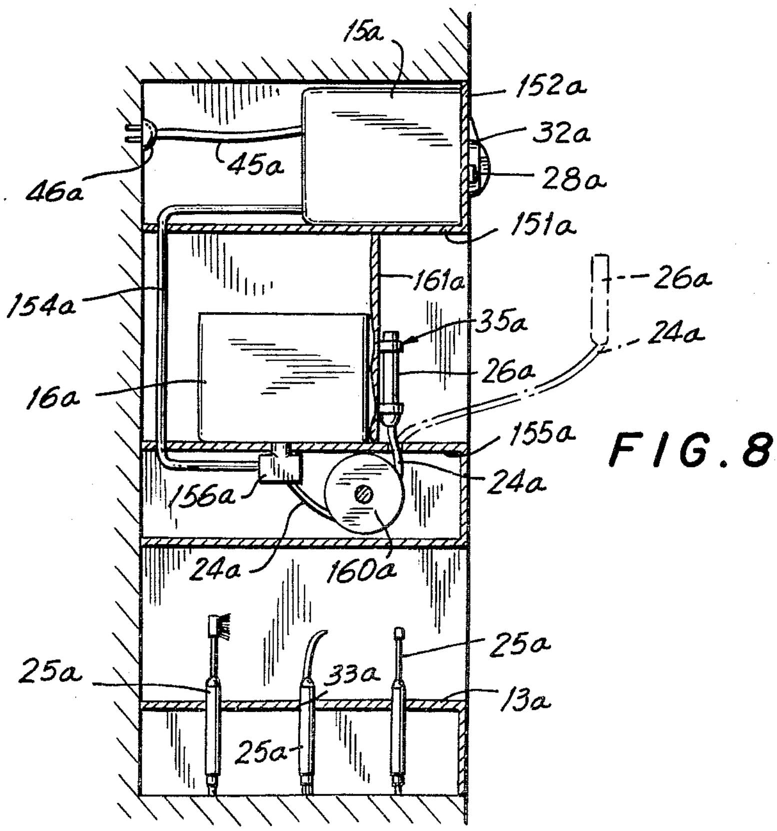
FIG. 8

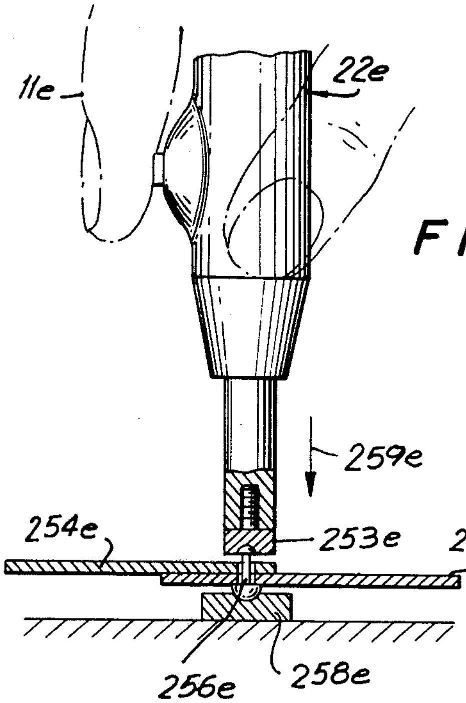
FIG. 25
FIG. 26
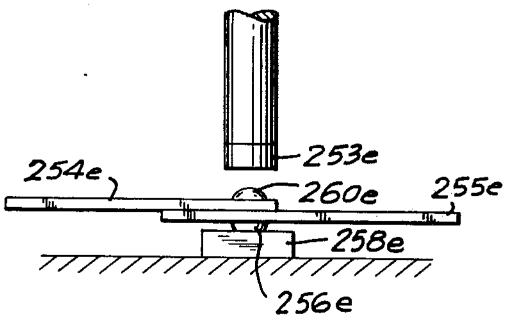
FIG. 27
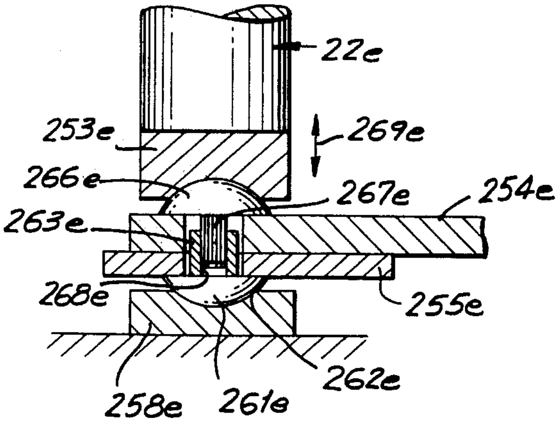
FIG. 28
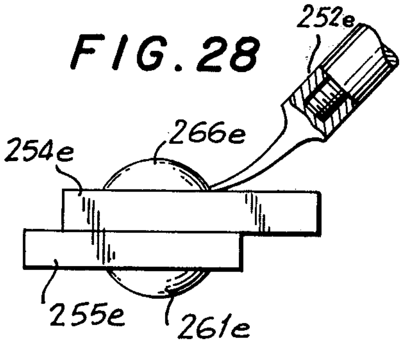

ULTRASONIC MOTORS AND CONVERTERS

This is a continuation, of application Ser. No. 426,822 filed Jan. 31, 1974, now abandoned.

CROSS REFERENCE TO RELATED APPLICATIONS

This application is in part a continuation, in part a divisional and in part a continuation-in-part of our co-pending patent application Ser. No. 119,298 filed Feb. 26, 1971 now U.S. Pat. No. 3,809,977, issued May 7, 1974 and reissued on Mar. 30, 1976 as U.S. Pat. No. 28,752, entitled ULTRASONIC KITS AND MOTOR SYSTEMS, and a continuation-in-part of our co-pending applications Ser. No. 209,971, filed Dec. 20, 1971 now U.S. Pat. No. 3,924,335, issued Dec. 9, 1975, entitled ULTRASONIC DENTAL AND OTHER INSTRUMENT MEANS AND METHODS and Ser. No. 318,428, filed Dec. 26, 1972 now U.S. Pat. No. 3,828,770 issued Aug. 13, 1974 for ULTRASONIC METHOD FOR CLEANING TEETH, which entire subject matter of the co-pending applications are incorporated herein by reference as if fully set forth herein.

BACKGROUND OF THE INVENTION

The present invention relates to an ultrasonic unit adapted to be used for home, professional and industrial applications to perform a variety of functions, as well as motor designs and power sources available therefore.

Heretofore, the use of ultrasonic energy has been directed towards the medical and industrial markets without any major attempt to enter the home consumer field via products incorporating an ultrasonic motor adapted to be hand held with a complimentary converter for increasing the normal 60-cycle per second house current to an ultrasonic range, of say 40,000 cycles per second, to energize the motor.

Applicants have discovered that it is possible to produce home oriented products, by supplying to the consumer a basic kit that permits the user a major degree of flexibility in the application of ultrasonic energy to a number of areas. Accordingly, the present invention permits one or more kits which may be variously designated as:

1. An ultrasonic hobby kit.
2. An ultrasonic multi-duty home service kit.
3. An ultrasonic universal chores kit.
4. An ultrasonic home workshop and the like.
5. An ultrasonic cosmetric kit which may include a razor, water pick, toothbrush, or prophylaxis unit.

An essential aspect of the ultrasonic motor technology today requires an electrical converter to increase the frequency of the normal house current to an ultrasonic rate, which rate for purposes of this invention is defined within the range of approximately 5,000 to 1,000,000 cycles per second. Accordingly, the present invention in each of its various forms provides a converter, either adapted to be plugged directly into an electrical outlet through an electrical cord or connected to a battery. The converter is electrically connected to the motor which is designed to convert the electrical energy into mechanical vibrations at an ultrasonic rate. The present invention provides various converters adapted to be used in connection with variously housed motors adaptable for a number of applications.

In connection with the home consumer market particularly, the cost to date of the ultrasonic motor-converter systems has hindered the introduction of ultrasonics into the consumer field in any sizeable scale. This invention provides a way for producing the ultrasonic system with the versatility necessary for practical application thereof on an economical basis.

OBJECTS OF THE INVENTION

A primary object of the present invention is to provide and new and novel ultrasonic motor-converter system for multi-purpose use.

Another object of the present invention is to provide a series of accessories for use with an ultrasonic motor adaptable to be interchangeable so as to produce a series of effects therewith.

Another object of the present invention is to provide a kit including a number of items that may be assembled with ultrasonic energy.

Another object of the present invention is to provide a new and novel ultrasonic motor.

Another object of the present invention is to provide a variety of ultrasonic kits adaptable for consumer and commercial use both in the home and industry.

Another object of the present invention is to provide a new and novel ultrasonic converter.

Other objects of the invention will be apparent as the description proceeds.

SUMMARY OF THE INVENTION

The apparatus, in accordance with one aspect of the invention, includes an ultrasonic motor capable of vibration in a plurality of frequencies and a driving circuit for sustaining the vibration of the motor at a desired frequency. A tuned circuit tuned to a band including the desired frequency receives a detected signal representative of the frequencies of vibration of the motor and passes only the desired frequency.

In accordance with another aspect of the invention, the apparatus includes a home consumer unit adapted for use for cosmetic purposes, having a plurality of interchangeable accessories to permit the user to carry out various functions with the ability of quick interchangeability and replacement so that various members of the household may have access to the ultrasonic energy imparted to the accessory with a single power source or converter being employed.

In accordance with another aspect of the invention, an ultrasonic kit is provided to permit the user to use ultrasonic energy for various hobby purposes; and the kit includes the ultrasonic motor, converter, and a series of interchangeable accessory elements that function in various manners to carry out the hobbycraft functions. The word "hobbycraft" is used to include various household functions, and is not limited to hobbies per se. The kit further may include various plastic, wood, or metallic parts of various shapes and configurations to be assembled by, or used with, the ultrasonic instrument.

In accordance with another aspect of the invention, a novel ultrasonic motor is disclosed, which provides an interchangeability of an entire motor that may be plugged or otherwise quickly coupled to a power source such that quick interchangeability is available for various uses.

In accordance with another aspect of the invention, a novel converter design is disclosed that is battery powered so as to be able to drive an ultrasonic motor for a variety of functions.

In accordance with another aspect of the invention, a novel motor-converter system is disclosed in which driving crystals are utilized for powering the motor and a sensing crystal is utilized for monitoring the frequency of the motor.

In accordance with another aspect of the invention, a plastic fastener is disclosed capable of ultrasonic assembly to define a rivet-like connection between two objects.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

FIG. 7 is a perspective view of an ultrasonic hygenic kit in use;

FIG. 8, is a side elevational view in section of the kit illustrated in FIG. 7;

FIG. 25, is an enlarged view partially in section, of a removable element for use in assembly of component parts;

FIG. 26, is a view similar to FIG. 25 showing the completed assembly operation;

FIG. 27, is a view similar to FIG. 25 of a novel fastener being assembled;

FIG. 28, is a view illustrating the removal of the head formed on the fastener;

PREFERRED EMBODIMENTS OF THE INVENTION

Figure 1:
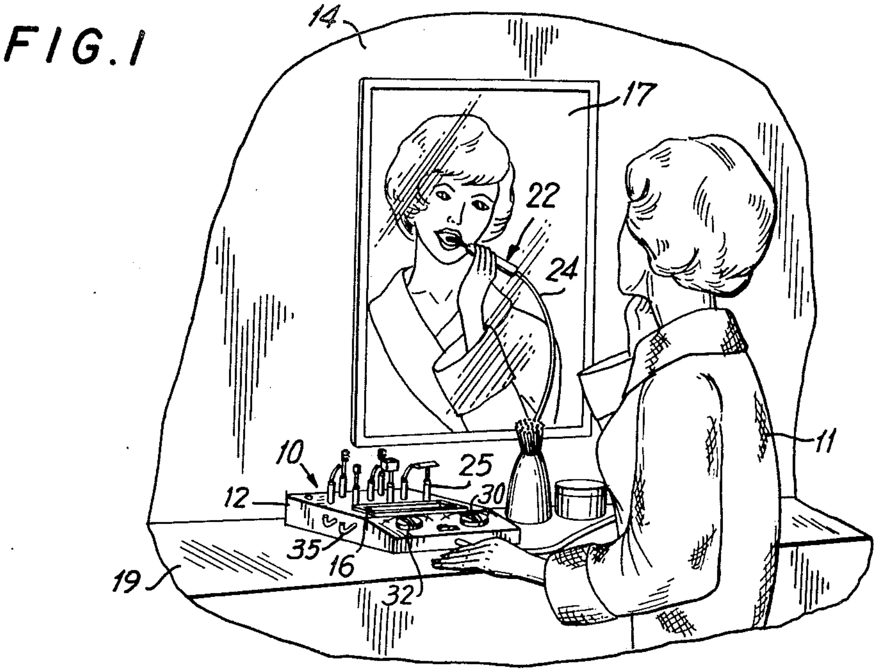
FIG. 1, is a perspective view of an ultrasonic hygenic kit in use.
Figure 2:
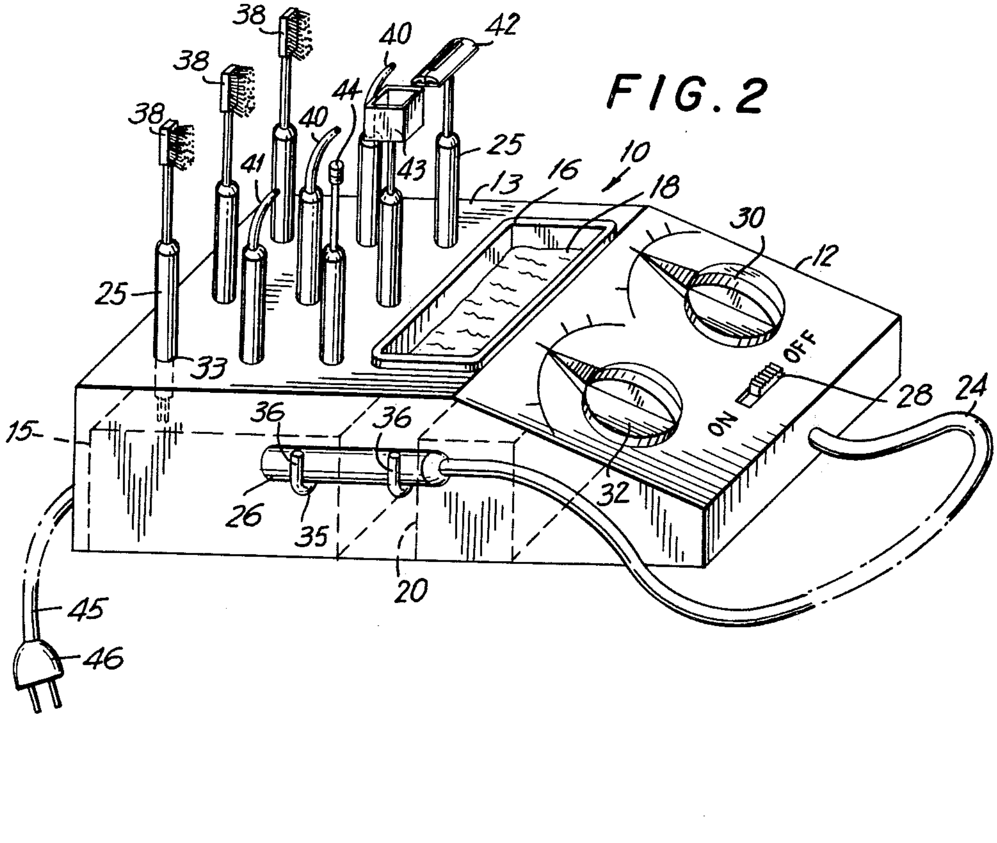
FIG. 2, is a perspective view of the ultrasonic kit as adapted for use.

Turning now to the drawings and particularly to FIGS. 1 and 2 thereof, we have disclosed an ultrasonic system or kit generally indicated by the reference numeral 10, for use by one or more users 11, seen to include a cabinet 12, on table 19, which contains therein an ultrasonic converter 15, as well as a tray or reservoir 16 forming a reservoir on the top 13 thereof, and containing a supply of liquid 18, which, in a conventional manner, is pumped from the reservoir 16 by pumping means 20 contained within the cabinet 12 and connected to the tray 16 to permit the flow of liquid 18 through the pumping means 20. Ultrasonic instrument means 22 is coupled to the converter means 15 and pumping means 20 by cable means 24 which contains a current supply line and a liquid supply line. The ultrasonic instrument 22 is comprised of accessory or implement means 25, that may have various shapes and configurations, and adapted to be removably secured to adapter or coupling means 26. The cabinet 12 contains power control means in the form of a switch 28 having an "On" and "Off" position and a variable switch 30 to regulate the power of converter 15. A liquid means regulator includes a switch 32 that contains a dial to vary the rate of the pump 20, which pumps the fluid from the reservoir 16 through the cable 24 in a manner which is well known in the art.

The cabinet 12 is seen to include support means 35 which may extend from the side wall thereof in the form of bent arms 36 to support the adapter 26 when not in use. The upper surface 13 of the cabinet 12 includes retaining means in the form of a plurality of recesses 33 adapted to receive therein in vertical relationship in plurality of accessories 25, each adapted to be interchangeable with and readily connected to the adapter 26 as hereinafter more fully described with respect to FIGS. 3–6 and FIGS. 9–18. The actual accessory 25 may consist of an ultrasonic toothbrush 38, an ultrasonic water-pick 40, or an ultrasonic prophylaxis unit 41; said water-pick, toothbrush and prophylaxis unit may be made in accordance with U.S. Pat. No. 3,547,110 issued Dec. 15, 1970, by Lewis Balamuth and entitled, "Methods and Apparatus for Maintaining Tooth and Gingival Structures with Ultrasonic Energy," and which patent is assigned to the assignee of the present invention. Another accessory in the form of an ultrasonic razor 42 may also be interchangeable with the adapter 26 and said razor may be of the type disclosed in U.S. Pat. No. 3,610,080 issued Oct. 5, 1971 to Arthur Kuris and entitled, "Ultrasonic Method and Apparatus for Shaving," and assigned to the assignee of the present invention. Another accessory 25 may be in the form of a container 43 adapted to receive therein a fluid which accessory may be used by the user by inserting their finger therein for doing their nails, to perform a cleansing or other operation thereon. Another accessory 44 may be in the form of a polishing head for polishing and performing other beauty care treatments.

The ultrasonic kit 10, as seen with respect to FIG. 1, and for which the user 11 is using an ultrasonic toothbrush in the mirror 17 on wall 14, permits each family to have their own accessory 25 available to them such that it may be readily interchangeable and connected to the adapter 16 so that when the connection is made electrical energy is transmitted to the working end of the accessory which, as indicated above, may take various shapes and forms and there is disclosed herein are only a sampling of those that might be used in accordance with the present invention. The kit illustrated in FIGS. 1 and 2 is seen to include an electrical plug 46 which is in a conventional manner plugged into a wall outlet and connected by cable 45 to the generator or converter 15 that converts the normal 60-cycle house current to an ultrasonic rate, which as herein designed, is to include the frequency range of 5,000 cycles to 1,000,000 cycles per second. Obviously, the converter 15 may be battery powered as hereinafter described, or the type in which it is battery powered, as hereinafter described, or the type in which it is battery powered for traveling but having a feature in which case a plug would still be utilized.

Accordingly, FIGS. 1 and 2 illustrate a new and novel ultrasonic instrumentation that affords the user, for the first time, to have a variety of ultrasonic implements 25 available to him in a compact manner, to be useable with minimum effort by an entire family in the home. In use, the user 11 merely selects the particular accessory 25 desired for a particular need and then sets out to manually insert the accessory 25 into the adapter 26 in a simple easy manner. The power may then be energized by the "On" and "Off" switch 28 and the amount of liquid 16 from the reservoir 16, if any is desired, may then be selected by the variable switch 32, and the power level selected by variable control switch 30. When the user has completed the use of the accessory 25, he or she may then remove the accessory 25 from the adapter 26, replacing it in the selected retaining means 33 provided therefor and return the adapter to its support means 35.

Figure 4:
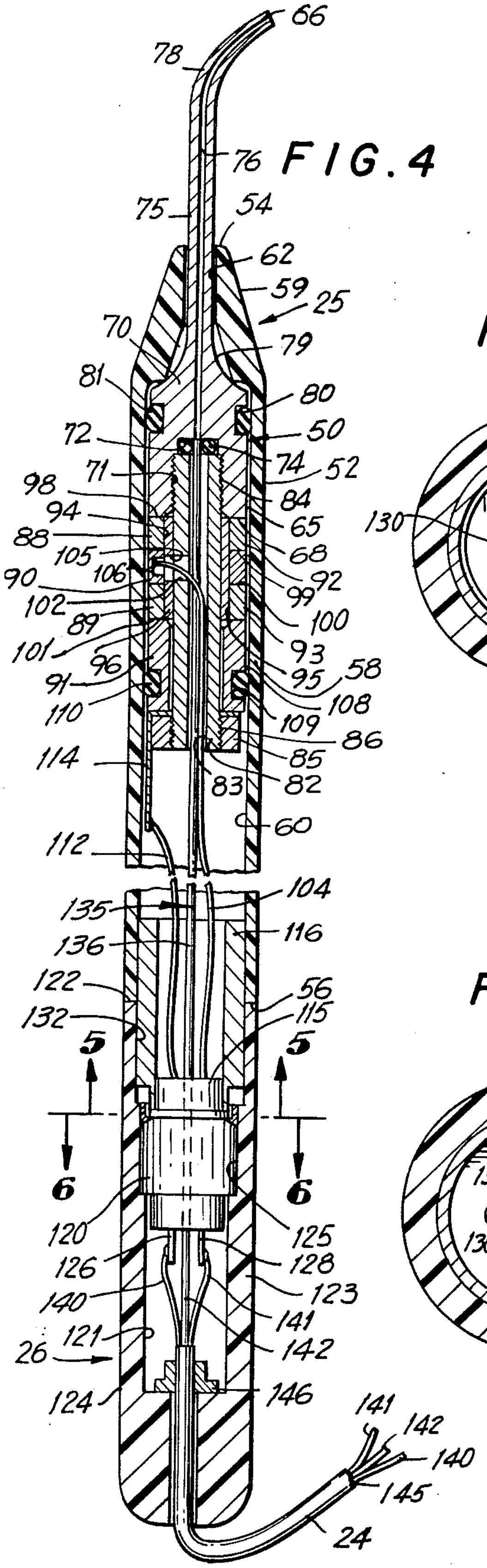
FIG. 4, is a side elevational view in cross-section of the instrument means in assembled relationship taken along a medial plane.
Figure 5:
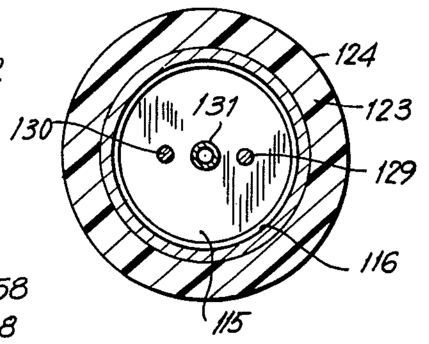
FIG. 5, is a view in cross-section taken along the plane indicated by the line 5—5 in FIG. 4.
Figure 6:
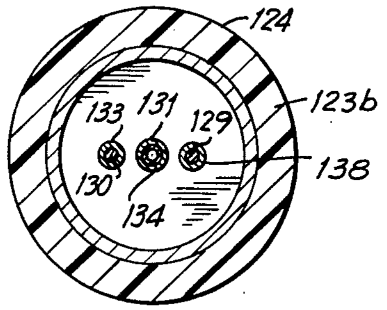
FIG. 6, is a view in cross-section taken along the plane indicated by the line 6—6 in FIG. 4.

FIGS. 4–6 illustrate one form of accessory 25, and adapter 26, construction that may be utilized in accordance with the embodiments of the invention illustrated in FIGS. 1 and 2. The accessory 25 includes an ultrasonic motor or transducer means 50 contained in a tubular housing 52 having a front end 54 and a rear end 56 with the outer wall 58 of the housing 52 having any desired contoured shape or configuration to facilitate it being handled by the user, and a tapered section 59 terminating at the front end 54 of the housing 52 with a chamber or cavity means 60 extending from the rear end 56 of the housing 52 and connected to an axial opening 62 which in turn terminates at the front end 54.

As seen with respect to FIG. 4, the ultrasonic motor 50 is contained within the housing cavity 60 and the hand piece housing 52 may be of plastic or any other suitable material.

The ultrasonic motor 50 includes a transmission member 65 terminating at a working output end or tip 66 at one end thereof and having a rear surface or face 68 at its opposite end. the transmission member 65 may be designed in the form of an accoustical impedance transformer so that there is an increase in the amplitude of mechanical vibration from its rear face 68 to its front tip 66. The actual variations of cross sectional area to obtain the amplitude magnification is well known in the art. The transmission member 65 may be made of a metallic or plastic material depending upon its desired use, for example, if the implement as shown in FIG. 4 has a water feed associated therewith then the unit may be used for dentistry in the form of a dental prophylaxis unit by the dentist or in turn may be of a home consumer design to be used by the user in the home for maintaining teeth and gingival surfaces free of deposits normally contained on the teeth of the user. Essentially, the motor construction, as hereinafter described, for professional and home use, may be of similar design except that the relative power for a home consumer unit would be less than that of a professional unit which is used by the dentist since in the home the user is in a sense doing over a six-month period what the dentist might be doing at one sitting in the dentist's office. Accordingly, the tip 66 may be of a plastic or metallic material depending upon the use thereof and the magnitude of ultrasonic mechanical vibrations to be imparted thereto.

The transmission member has a circular rear section 70 and front section 75, with an internally threaded bore 71 extending from its rear face 88 and terminating in a seat 72 adapted to contain therein sealing means as in the form of an o-ring 74 as hereinafter explained. Communicating with the bore 71 is a longitudinally extending passageway 76 that extends to the front tip 66 of the transmission 65 through the front section 78, which is illustrated to have a curved or contoured portion 78 to permit ready access within the oral cavity. Obviously, the shape, contour and cross sectional area of the passageway 76 may be designed to obtain various spray patterns or flow rates and further, the tip 66 may be designed so as to obtain flexural, lateral, torsional, elliptical, linear or longitudinal motion, by proper control of the shape of the front section 75 of the transmission member which has the bent tip portion 78 formed therewith.

The transmission member 65 has a contoured radius 79 connecting together the front section 75 and the rear section 70 of the transmisson member 65, which sections may be both of circular cross sectional area such that the front section 76 extends out beyond the front end 54 of the housing 52 a sufficient distance and through the opening 62 provided therefor. The transmission member 65 may contain an annular depression 80 for motor mounting means, illustrated to be in the form of an o-ring 81, but it may take other forms and shapes as desired. Extending from the rear face 68 of the transmission member 65 is a support member or shaft 82 having a threaded portion 84 which engages the threaded portion 71 of the transmission member 65 and an axially extending passageway or opening 83. The rear end of the support member 82 also has a threaded portion 86 which receives locking means in the form of a nut 85 threaded thereon and adapted to sandwich therebetween under a selected compressive static load a pair of piezoelectric crystals 88 and 89 that may be of a lead zirconate or lead titanate ceramic crystal material, formed so as to be capable of ultrasonic vibrational activity in its longitudinal direction when activated by high frequency electrical impulses delivered to it as will be described. The crystals have an external diameter 92 and 93 respectively, which is smaller than the internal diameter of the chamber 60 such that sufficient clearance therebetween is obtained. The internal diameters 94 and 95 of the respective crystals 88 and 89 have a diameter which permits an insulating tubular sleeve 96 to be positioned in surrounding relationship over the support member 82, and extends the length from the front face 98 of crystal 88 to the rear face 101 of the crystal 89. The sleeve 96 is made preferably from an insulative material such as plastic so as to isolate the crystals from the electrode 90 that extends between the rear face 99 of crystal 88 and the front face of crystal 100 of crystal 89.

To permit wiring of the motor, wire lead 104 extends through the passageway 83 with the support member 82 having a longitudinally extending opening 102 through the support member wall and through an opening 105 in the insulator sleeve 96 and terminating in a pocket 106 within the disc shaped electrode 90. The wire 104 is soldered or otherwise attached to the electrode 90 for electrical purposes. The rear member 91 fits in telescopic relationship to the support member 82 and has an external diameter 108 which is less than the internal diameter of the chamber 60.

The mounting means for the motor 50 in the housing means 52 consists of spaced apart o-rings 81 and 110 such that the vibrational energy of the motor when energized, remains substantially isolated therein without the energy being transmitted to the housing 52. A peripheral o-ring seat 109 is provided for o-ring 110 in the housing 52.

Locking means in the form of a nut 85 is secured to the rear threaded portion 86 on shaft 82 and is tightened to the point where an axial compressive force is sufficient to compress the crystal 88, electrode 90, crystal 89, and rear section 91 with a predetermined amount of torque. Depending upon the size of the crystals and power of the motor, an epoxy material may be used to bond the parts and crystals together and form the locking means.

As part of the electrical connecting means, a ground lead or conductor 112 is connected to a lug 114, a portion of which extends beneath the nut 85, such that the power leads 104 and 112 are in turn connected to a power source as hereinafter explained.

The ultrasonic motor 50 although shown as piezoelectric may be one of a variety of electromechanical types, such as electrodynamic, piezoelectric or magnetostrictive, and designed for effecting ultrasonic vibrations through hand directed tools of suitable configuration, or larger ones, which are readily replaceable or inter-changeable with other work performing tools or accessories such as for use as acoustically vibrated material treating devices. The motor 50 has components rigidly joined, in end-to-end relationship to form a unit or assembly which is removably supported in a housing containing electrical coupling means to the transducer and receiving alternating current.

The ultrasonic motor 50 is longitudinally dimensioned so as to have lengths which are generally whole multiples of half-wavelengths of the compressional waves established therein at the frequency of the combined longitudinal length of the components so that longitudinal loops or other components of motion occur at the end 66 of the output surface of the transmission member 65. Thus, the optimum amplitude of longitudinal vibration and hyper-accelerations of transmission or coupling member 65 is achieved, and such amplitude is determined by the relationship of the masses of the rear section 70 and front section 75 which may be made effective to either magnify or reduce the amplitude of the vibrations received from the transducer crystals. The front section 75 may be permanently attached to the rear section 70, or the front section 75, or part thereof, may be provided with a threaded stud adapted to be screwed into a tapped hole in the end of the transmission member 65 for effecting rigid connection of a removable element thereto.

The rear end 56 of the casing or housing 52 has an electric connector or plug 115 connected thereto by means of a bushing 116, which extends beyond the rear end of the housing 52 and may be secured thereto in any conventional manner. The connector 115 is seated at one end of the bushing 116 and adapted to mate with an opposite type connector 120; i.e., female, such that electrical energy may be transmitted to the motor 50.

The adapter 26 is designed to match the rear end of the housing 52 and includes a cavity 121 having a front and 122 which abuts the rear end 56 with a wall portion 123 having an external diameter 124 that may be of the same outside diameter as the housing 52. The female connector 120 is contained within a counterbore 125 having electrical contacts 126 and 128 and may be seated therein by a press fit such that the electrical terminals or prongs 129 and 130 and water feed 131 of the connector 115, as seen in FIG. 5 and 6, are adapted to mate with the female receptacle 120 having receiving prongs or contacts 133, 134 and 138. The terminals 129, 130 and 131 extend from the front of the connector 115 and the two power leads 104 and 112 are connected to 129 and 130 respectively and, in turn, to prongs 133 and 134 which connect to contacts 126 and 128 respectively. The sleeve 116 extends in telescopic relation to the adapter 26 and by a frictional fit extends within the seat 132 on the front of adapter housing 26. The present embodiment of the ultrasonic motor system is adapted to have a fluid pass therethrough such that the instrument may be used as a water pick or dental prophylaxis unit and accordingly, fluid supply means 135 is provided in the form of a flexible tube or conduit 136 that extends through the sleeve 116 and is coupled to the receptacle 115 which in turn has its prong 131 that mates with prong 134 in receptacle 120 in a conventional manner. The conduit 136 extends from the receptacle 115 and through the axial bore 83 in the shaft 82 to be in axial alignment with the passageway 76 extending from the bottom surface or seat 72 to the tip 66 of the transmission member 65. The conduit 136 may abut the bottom of the seat 72 and be retained in place by sealing means in the form of an o-ring 137 to afford a structurally fluid tight seal. Other means of coupling the front to the fluid connecting member 136 may be utilized in order to have a continuous flow of fluid, such as water, from a desired source, which may be from a tap or a mechanical pump as discussed with respect to FIGS. 1 and 2, for maintaining a stream of fluid on a continuous or intermittent basis. The vibratory mechanical energy generated in the motor is in turn transmitted to the fluid through the front member as discussed in accordance with U.S. Pat. No. 3,547,110.

The contacts 126 and 128 have wires 140 and 141 connected thereto and liquid conduit 142 connects to terminal 134, with all being contained within a flexible sheath 145 and together forming cable 24. A stop member 146 firmly grips the sheath 145 and memers therein.

Figure 3:
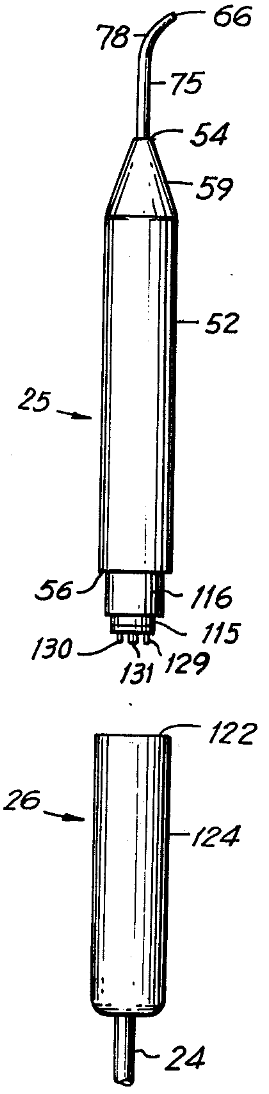
FIG. 3, is a side elevational view of ultrasonic instrument means for use in the present invention.

FIGS. 7 and 8 illustrate an ultrasonic kit 10*a* of a similar nature to that illustrated in FIGS. 1 and 2, except that the entire kit 10*a* is situated within a cabinet 12*a* that is built within the wall 14*a* of the home of the user 11*a* and access to the accessories 25*a* as well as the power On-Off switch 28*a*, power regulation 30*a* and fluid regulator switch 32*a* are obtained by opening the door 150*a* to the cabinet 12*a*. As seen in particular with respect to FIG. 8, the cabinet 12*a* contains a lower shelf 13*a* or wall having a plurality of openings 33*a* and each opening adapted to receive therein an accessory 25*a* which may be of the type discussed above with respect to FIGS. 1 and 2. The upper portion of the cabinet 12*a* contains an upper wall 151*a* and a front panel 152*a* through which the knob control switches 28*a*, 30*a* and 32*a* extend with the converter 15*a* positioned on the upper wall 151*a* and connected to the normal house current via cable 45*a* and plug 46*a*. An electrical power cable 154*a* extends from the converter 15*a* through the upper wall 151*a* and through a middle wall 155*a*, which latter wall supports the reservoir 16a which, as seen in FIG. 3 may be readily removed for replenishing the supply of liquid therein. The bottom of the reservoir 16*a* is coupled to a fitting 156*a* in which the power cable 154a is connected to, and fluid supply and power supply merge into cable 24*a*, and are then wound on a spring loaded or other commercially type available take-up or retracting means in the form of a reel 160a such that the adapter 16*a* from its retracted position as seen in FIG. 8 is retained in place by supporting means 35 with support arms or clips 36*a*, mounted on panel 161a to its extended position as seen in FIG. 7 so that it is ready for use by the user 11a. The manner of operation is similar to that described in FIGS. 1 and 2, and by supplying a spring loaded take-up reel 160*a*, the problems of a loose cable 24*a* are climinated. FIGS. 9–13 illustrate another form of accessory 25*b* and adapter 26*b* that may be utilized in accordance with the embodiments of the invention illustrated in FIGS. 1 and 2, and 7 and 8, and having an added feature of a removable element 165*b*. The accessory 25*b* includes an ultrasonic motor or transducer means 50*b* contained in a tubular housing 52*b* having a front end 54*b* and a rear end 56*b* with the outer wall 58*b* of the housing 52*b* having any desired contoured shape or configuration to facilitate it being handled by the door, and a tapered section 59*b* terminating at the front end 54*b* of the housing 52*b* with a chamber or cavity means 60*b* extending from the rear end 56*b* of the housing 52*b* and connected to an axial opening 62*b* which in turn terminates at the front end 54*b*.

Figure 10:
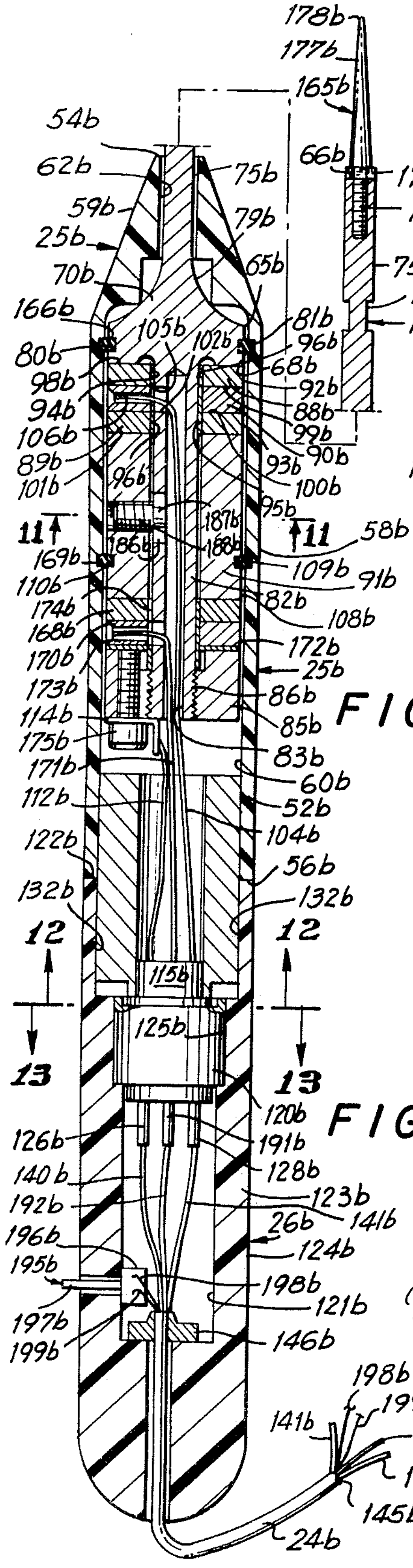
FIG. 10, is a side elevational view in cross-section of the instrument means in assembled relationship taken along a medial plane.

As seen with respect to FIG. 10, the ultrasonic motor 60*b* is contained within the housing cavity 60*b* and the hand piece housing 52*b* may be of plastic or any other suitable material. The ultrasonic motor 50*b* includes a transmission member 65*b* terminating at a working output end or tip 66*b* at one end thereof and having a rear surface or face 65*b* at its opposite end. The transmision member 65*b* may be designed in the form of an acoustical impedance transformer so that there is an increase in the amplitude of mechanical vibration from its rear face 68*b* to its front tip 66*b*. The actual variations of cross sectional area to obtain the amplitude magnification is well known in the art. The transmission member 65*b* may be of a metallic or plastic material depending upon its desired use with the removable element 165*b* having a water feed through as shown in FIG. 4; then the unit may be used for dentistry in the form of a dental prophylaxis unit by the dentist or in turn may be of a home consumer design to be used by the user in the home for maintaining tooth and gingaval surfaces free of deposits normally contained on the teeth of the user. Essentially, the meter construction, as hereinafter described, for professional and home use, may be of similar design except that the relative power for a home consumer unit would be less than that of a professional unit which is used by the dentist, since in the home the user is in a sense doing over a six-month period what the dentist might be doing at one sitting in the dentist's office. Accordingly, the removable element 165B may be of a plastic or metallic material depending upon the use thereof and the magnitude of ultrasonic mechanical vibrations to be imparted thereto.

The transmission member 65*b* has a contoured radius 79b connecting together the front section 75*b* and the rear section 79*b* of the transmission member 65*b*, which sections may be both of circular cross sectional area such that the front section 75*b* extends beyond the front end 54*b* of the housing 52*b* a sufficient distance and through the opening 62*b* provided therefor. The transmission member 65*b* may contain an annular depression 80*b* and casing 52*b* with an annular depression 166*b*, for motor mounting means, illustrated to be on the form of an o-ring 81, positioned in each of said depressions. Extending from the rear face 65*b* of the transmission member 65b is a support member or shaft 82b that may be integrally formed therewith, and having an axially extending passageway or opening 83*b*. The rear end of the support member 82*b* has a threaded portion 86b which receives locking means in the form of a nut 85b threaded thereon and adapted to sandwich therebetween under a selected compressive static load a pair of driving piezoelectric crystals 88b and 89*b* and a third crystal 168*b* forming part of the sensing means, that may be of a lead zirconate or lead titanate ceramic crystal material, formed so as to be either capable of ultrasonic vibrational activity in its longitudinal direction when activated by high frequency electrical impulses delivered to it, or detecting the frequency of the motor, as will be described. The driving crystals have an external diameter 92*b* and 93*b* respectively, which is smaller than the internal diameter of the chamber 60*b* such that sufficient clearance therebetween is obtained. The internal diameters 94*b* and 95*b* of the respective crystals 88*b* and 89*b* have a diameter which permits an insulating tubular sleeve 96*b* to be positioned in surrounding relationship over the support member 82*b*, and extends the length from the front face 98*b* of crystal 88*b* to at least the rear face 101*b* of the crystal 89*b*. The sleeve 96b is made preferably from an insulative material such as plastic so as to isolate the crystals from the electrode 90*b* that extends between the rear face 99*b* of crystal 88b and the front face of crystal 100*b* of crystal 89*b*.

To permit wiring of the motor, wire lead 104*b* extends through the passageway 83*b* with the support member 82*b* having a longitudinally extending opening 102*b* through the support member wall and through an opening 105*b* in the insulator sleeve 96*b* and terminating in a pocket 106*b* within the disc shaped electrode 90*b*. The wire 104*b* is soldered or otherwise attached to the electrode 90*b* for electrical purposes. The rear member 91*b* fits in telescopic relationship to the support member 82*b* and has an external diameter 108*b* which is less than the internal diameter of the chamber 60*b*.

A peripheral o-ring seat 109*b* is provided on the support member 82*b* and an o-ring seat 169*b* is provided in the cavity 86*b* for o-ring 110*b* such that the mounting means for the motor 56*b* in the housing means 52*b* consists of spaced apart o-rings 61*b* and 110*b* such that the vibrational energy of the motor when energized, remains substantially isolated therein without the energy being transmitted to the housing 52*b*. By providing o-ring seats in the housing 52*b* as well as on the motor 50b axial movement of the motor relative to the housing is substantially prevented when a force is applied to the removable element 165*b*.

The motor 50b illustrated in FIG. 10 has frequency sensing means in the form of a third crystal 168*b* which abuts the rear member 91*b* on one side thereof and an electrode 170*b* on its opposite side with an insulating washer 172*b* between the electrode 170*b* and locking nut 35*b*. A tubular sleeve 174*b* of insulating material extends on the support member 82*b* at least the axial length of the crystal 168*b*, electrode 170*b* and washer 172*b*. A wire lead 171*b* is connected within a pocket 178*b* and in turn is connected to the connector 115*b*.

The nut 85*b* forming the locking means is secured to the rear threaded portion 86*b* on shaft 82*b* and is tightened to the point where an axial compressive force is sufficient to compress the crystal 88*b* electrode 90*b*, crystal 89b, rear section 91*b*, crystal 168*b* and electrode 170*b*, with a predetermined amount of torque.

As part of the electrical connecting means, a ground lead or conductor 112*b* is connected to a lug 114*b*, a portion of which extends beneath the head of a screw 175*b* that is screwed into nut 85*b*, such that the power leads 104*b* and 112b are in turn connected to a power source as hereinafter explained.

The accessory 25*b* in this form of the invention is seen to include element means 165*b* that is designed to be removable from the front section 75*b* of the motor 50b. Various forms of the attachment may be employed so that the user may conveniently and quickly replace the element 165*b* with minimal effort. One such form is shown in FIG. 10 in which the element means 165*b* includes a neck portion 177*b* terminating in a head portion 178*b*, with the neck portion illustrated in the form of a cone. The neck portion may take various forms and shapes to permit the user to perform various jobs with them--such as a knife for cutting materials, a bent tip for various modes of vibration and permitting access to various areas, etc. The neck portion 177*b* merges with a body portion 179*b*, illustrated in the form of a hexagon nut to permit it to be grapped for tightening and loosening it relative to the motor 50*b*. The fastening portion 180*b* may be integrally formed with the body portion 179*b* and may be in the form of threads to threadably engage a tapped portion in the front section 75*b*.

To assist in tightening and loosening the removable element 165*b*, securing means 181*b* may be employed in the form of a pair of flats or slots 182*b* to be gripped by a wrench. In this manner one wrench is applied at body portion 179*b* and another at the slots 182*b* and turned relative to each other until firmly secured in place.

Figure 11:
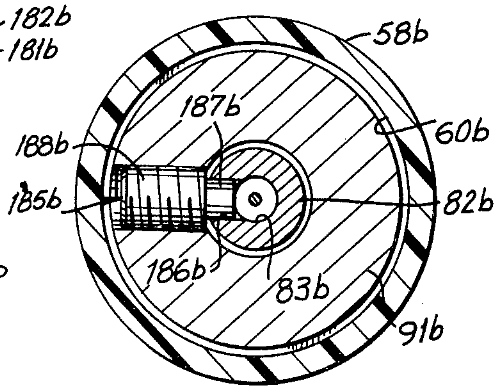
FIG. 11 is a view in cross-section taken along the plane indicated by the line 11—11 in FIG. 10.

To aid in assembly of the motor 50*b* positioning means 185*b* may be provided as seen in FIGS. 10 and 11 to prevent angular rotation, but not longitudinal displacement, of the year member 91*b* relative to the support member 82*b* when the nut 85*b* is tightened. The positioning means 185*b* includes a transverse opening 186*b* in the support member 82*b* dimensioned to accept the lip 187*b*, of a screw 188*b* which is threadably engaged in the rear member 91*b*, with a minimum of clearance. In this manner, the rear member 91*b* moves in the longitudinal direction to compress the crystals 88*b* and 89*b* when the nut 85*b* is rotated. At the completion of the assembly of the motor 50*b*, the screw 188*b* may be removed or held permanently in place by an epoxy (not shown).

The rear end 56*b* of the casing or housing 52*b* has an electric connector or plug 115*b* connected thereto by means of a bushing 116*b*, which extends beyond the rear end of the housing 52*b* and may be secured thereto in any conventional manner. The connector 115*b* is seated at one end of the bushing 116*b* and adapted to mate with an opposite type connector 120*b;* i.e., female, such that electrical energy may be transmitted to the motor 50*b*.

Figure 12:
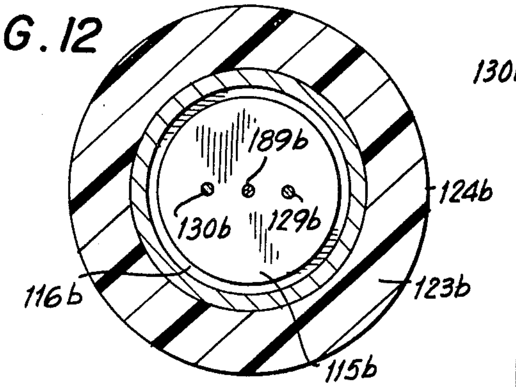
FIG. 12, is a view in cross-section taken along the plane indicated by the line 12—12 in FIG. 10.
Figure 13:
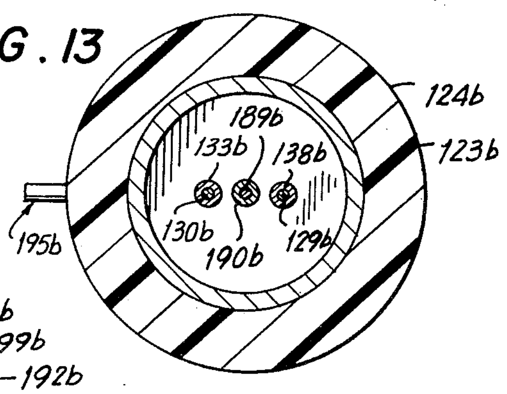
FIG. 13, is a view in cross-section taken along the plane indicated by the line 13—13 in FIG. 10.

The adapter 26*b* is designed to match the rear end of the housing 52*b* and includes a cavity 121*b* having a front end 122*b* which abuts the rear end 56*b* with a wall portion 123*b* having an external diameter 124*b* that may be of the same outside diameter as the housing 52*b*. The female connector 120*b* is contained within a counterbore 125*b* having electrical contacts 126*b* and 128*b* and may be seated therein by a press fit such that the electrical terminals or prongs 129*b*, 130*b*, and 189*b* of the connector 115*b*, as seen in FIGS. 12 and 13, are adapted to mate with the female receptacle 123*b* having receiving prongs or contacts 133*b*, 190*b*, and 138*b*. The terminals 129*b*, 130*b*, and 189*b* extend from the front of the connector 115*b* and the three power leads 104*b*, 112*b*, and 171*b* are connected to 129*b*, 130*b*, and 189*b* respectively and, in turn, to prongs 133*b*, 134*b*, and 189*b*, which connect to contacts 126*b*, 128*b*, and 191*b* respectively, as seen in FIG. 10. The sleeve 116*b* extends in telescopic relation to the adapter 26*b* and by a frictional fit extends within a seat 132*b* on the front of adapter housing 26*b*. The present embodiment of the ultrasonic motor system may be adapted to have a fluid pass therethrough such that the instrument may be used as a water pick or dental prophylaxis unit and accordingly, may be of the design as illustrated in FIGS. 3–6.

The contacts 126*b*, 128*b* and 191*b* have wires 140*b*, 141*b* and 192*b* connected thereto, with all being contained within a flexible sheath 145*b* and together forming calbe 24*b*. A stop member 146 firmly grips the sheath 145*b* and members therein.

Figure 9:
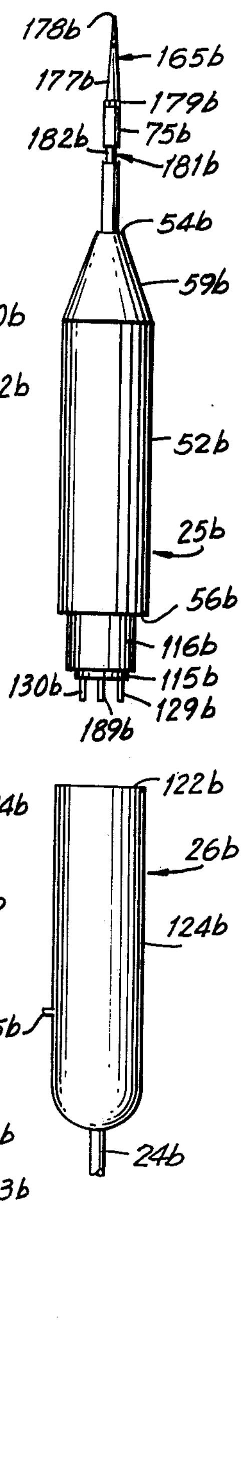
FIG. 9, is a side elevational view of ultrasonic instrument means for use in the present invention.

The motor 50*b* may have the current thereto controlled from either the convertor as illustrated in FIGS. 1 and 2, or switching means 195*b* may be provided on the instrument means on either the accessory 25*b* or on the adapter 26*b* as illustrated in FIGS. 9 and 10. The switching means 195*b* may include a switch 196*b* contained within the adapter housing 26*b* *with a push button 197b* extending through the wall 123*b* and externally of the adapter. Electrical leads 198*b* and 199*b* extend from the switch 196*b* and are connected to the convertor. The switch may be one of a variety of types commercially available.

FIGS. 14–18 illustrate another form of accessory 25*c* and adapter 26*c* that may be utilized in accordance with the embodiments of the invention illustrated in FIGS. 1 and 2; and 7 and 8, and having an added feature of the electrical coupling means 200*c* contained within the housing 52c so that the motor 50*c* is coupled to electrical contacts without any wires extending from the motor 50*c*. The accessory 25c includes an ultrasonic motor or transducer means 50c contained in a tubular housing 52c having a front end 54*c* and a rear end 56c with the outer wall 56c of the housing 52*c* having any desired contoured shape or configuration to facilitate it being handled by the user, and a tapered section 59*c* terminating at the front end 54*c* of the housing 52*c* with a chamber or cavity means 60c extending from the rear and 56c of the housing 52*c* and connected to an axial opening 62*c* which in turn terminates at the front end 54*c*.

The transmission member 65*c* has a contoured radius 79*c* connecting together the front section 75*c* and the rear section 70*c* of the transmission member 65*c*, which sections may be both of circular cross sectional area such that the front section 75*c* extends out beyond the front end 54*c* of the housing 52*c* a suffiicient distance and through the opening 60*c* provided therefor. Extending from the rear face 66*c* of the transmission member 65*c* is a support member or shaft 82*c* that may be integrally formed therewith. The rear end of the support member 82*c* has a threaded portion 86c which receives locking means in the form of a nut 85c threaded thereon and adapted to sandwich therebetween under a selected compressive static load a pair of during piezoelectric crystals 88*c* and 89*c*, and a third crystal 168*c* forming part of the sensing means, that may be of a lead sirconate or lead titanate ceramic crystal material, formed so as to be either capable of ultrasonic vibrational activity in its longitudinal direction when activated by high frequency of the motor, as will be described. The driving crystals have an external diameter 92*c* and 93*c* respectively, which is smaller than the internal diameter of the chamber 60c such that sufficient clearance therebetween is obtined. The internal diameters 94*c* and 95*c* of the respective crystals 88*c* and 89*c* have a diameter which permits an insulating tubular sleeve 96*c* to be positioned in surrounding relationship over the support member 82*c*, and extends the length from the front face 98*c* of crystal 88*c* to at least the rear face 101*c* of the crystal 89*c*. The sleeve 96*c* is made preferably from an insulative material such as plastic so as to isolate the crystals from the electrode 90*c* that extends between the rear face 99*c* of crystal 88*c* and the front face of crystal 100*c* of crystal 89*c*. The rear member 91*c* fits in telescopic relationship to the support member 82*c* and has an external diameter 108*c* which is less than the internal diameter of the chamber 60*c*.

The transmission member 65*c* may contain an annular depression 166*c*, for motor mounting means, illustrated to be in the form of an o-ring 81*c*, positioned in each of said depressions. A peripheral o-ring seat 169*c* is provided in the cavity 60*c* for o-ring 110*c* such that the mounting means for the motor 50*c* in the housing means 52*c* consists of spaced apart o-rings 81*c* and 110*c* such that the vibrational energy of the motor when energized, means substantially isolated therein without the energy being transmitted to the housing 52*c*. By providing o-ring seats in the housing 52*c*, as well as on the motor 50*c*, axial movement of the motor relative to the housing is substantially prevented when a force is applied.

Figure 15:
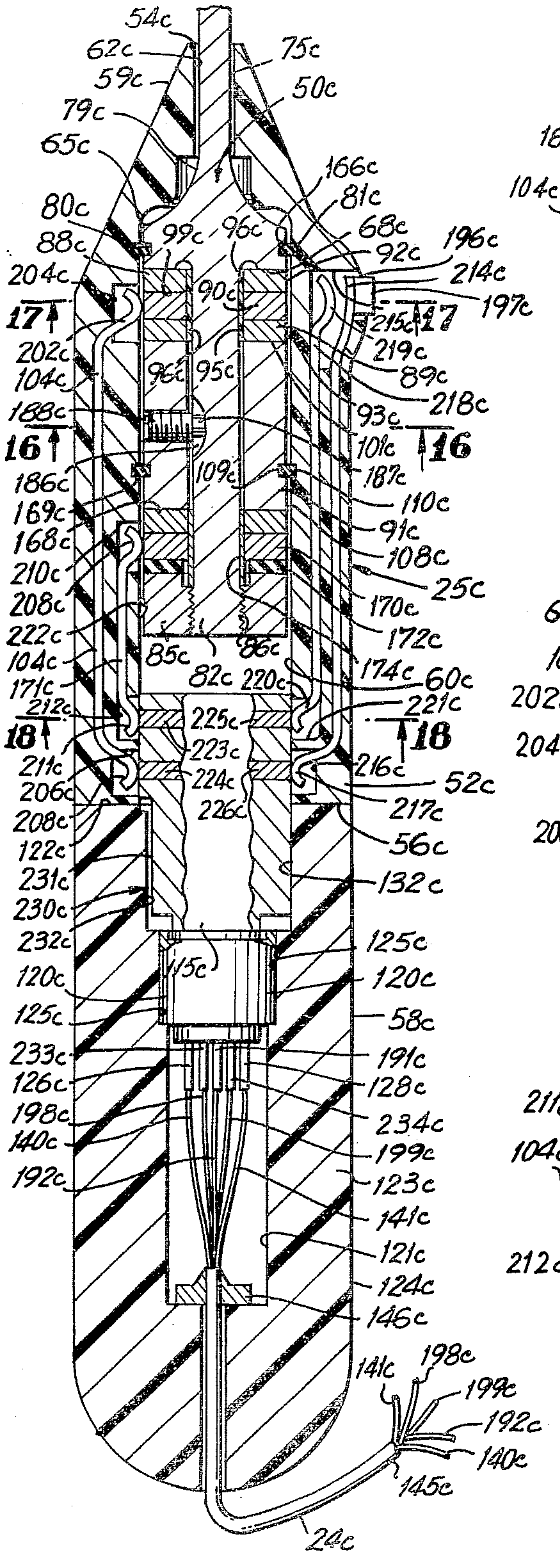
FIG. 15, is a side elevational view in cross-section of the instrument means in assembled relationship taken along a medial plane.

The motor 50*c* illustrated in FIG. 15 has frequency sensing means in the form of a third crystal 168*c* which abuts the rear member 91*c* on one side thereof and an electrode 170*c* on its opposite side with an insulating washer 172*c* between the electrode 170*c* and locking nut 35*c*. A tubular sleeve 174*c* of insulating material extends on the support member 82*c* at least the axial length of the crystal 168*c*, electrode 170*c* and washer 172*c*.

The nut 85*c* forming the locking means is secured to the rear threaded portion 86*c* on shaft 82*c* and is tightened to the point where an axial compressive force is sufficient to compress the crystal 88*c* electrode 90*c*, crystal 89*c*, rear section 91*c*, crystal 168*c* and electrode 170*c* with a predetermined amount of torque.

Figure 16:
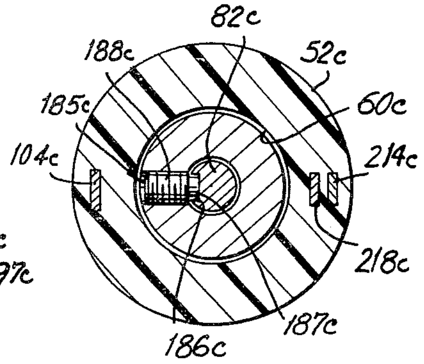
FIG. 16, is a view in cross-section taken along the plane indicated by the line 16—16 in FIG. 15.
Figure 14:
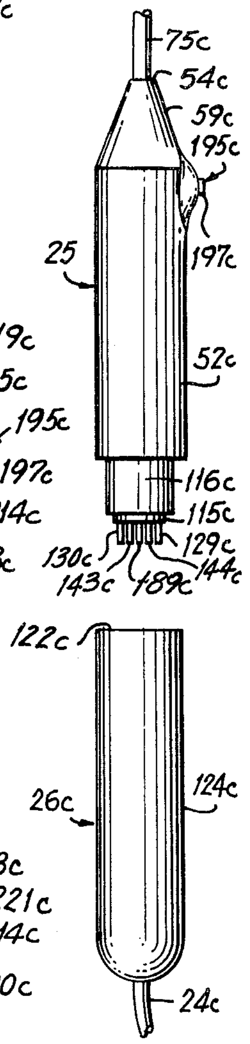
FIG. 14, is a side elevational view of ultrasonic instrument means for use in present invention.
Figure 17:
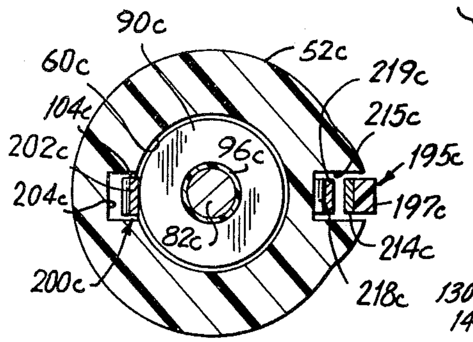
FIG. 17, is a view in cross-section taken along the plane indicated by the line 17—17 in FIG. 15.
Figure 18:
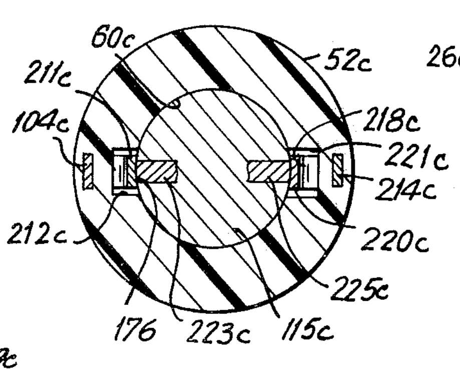
FIG. 18, is a view in cross-section taken along the plane indicated by the line 18—18 in FIG. 15.
Figure 19:
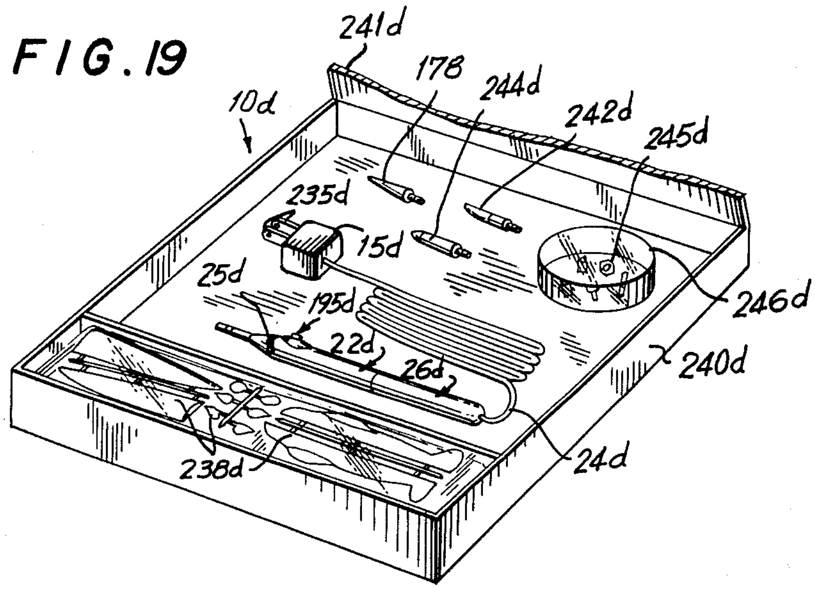
FIG. 19, is a form of kit that is primarily intended for the hobbyist.

To aid in assembly of the motor 50*c* positioning means 185*c* may be provided as seen in FIGS. 15 and 16 to prevent angular rotation, but not longitudinal displacement, of the rear member 91*c* relative to the support member 82*c* when the nut 85*c* is tightened. The positioning means 185*c* includes a transverse opening 186*c* in the support member 82*c* dimensioned to accept the lip 187*c* of a screw 188*c* which is threadably engaged in the rear member 91*c*, with a minimum of clearance. In this manner, the rear member 91*c* moves in a linear path to compress the crystals 88*c* and 89*c* when the nut 85*c* is rotated. At the completion of the assembly of the motor 50*c*, the screw 188*c* may be removed or held permanently in place by an epoxy (not shown). The adapter 26*c* is designed to match the rear end of the housing 52*c* and includes a cavity 121*c* having a front end 122*c* which abuts the rear end 56*c* with a wall portion 123*c* having an external diameter 124*c* that may be of the same outside diameter as the housing 52*c*. The female connector 120*c* is contained within a counterbore 125*c* and may be seated therein by a press fit such that the electrical terminals or prongs of the connector 115*c* are adapted to mate with the female receptacle 120*c* having receiving prongs or contacts. The connector 115*c* extends in telescopic relation to the adapter 26*c* and fits within a seat 132*c* on the front of adapter housing 26*c*. The present embodiment of the ultrasonic motor system may be adapted to have a fluid pass therethrough.

In this embodiment of the invention, electrical coupling means 200*c* is utilized such that the motor 50*c* is merely placed within the cavity 60*c* and held in place by the o-rings, or other mounting means; and complete electrical contact is accomplished such that no actual wiring of the motor takes place. In this manner, for high production quantities particularly, the problem of a soldered lead breaking due to the vibratory stress generated is eliminated. In addition, by molding in the electrical contacts within say a plastic housing, further savings are obtained in manufacturing costs. Essentially the wire lead are incorporated within the housing 52*c* as seen in FIGS, 15, 17 and 18.

The contact lead to the electrode 90*c* is a filament 104*c* that has a front hooked or bent section 202*c* contained in a pocket or recess 204*c* that is adapted to engage and transmit pressured contact thereagainst to couple the electrical energy thereto. The filament 104*c* may have a rectangular, circular or other cross-section, and extends substantially the length of the housing 52*c* and terminates openly in a rear recess 206*c* with a contoured portion 208*c* contained therein. The rear electrode 170*c* has electrical energy coupled thereto by means of filament 171*c* embodied in the casing 52*c* and having a front contoured portion 208*c* contained in a front recess 210*c* with a rear portion 211*c* in a rear recess 212*c*.

Switching means 195*c* is contained in the accessory 25*c* and adapted to be engaged by the user when operation of the motor is desired. The switching means 195*c* includes a switch 196*c* having a push button or contact 197*c* that extends beyond the housing for finger engagement and is coupled to a contact element 214*c* with its free end, contained within a cavity 215*c* contained within the housing 52*c*.

The switch 196*c* has the contact element 214*c* embedded within the housing wall and extending therethrough and terminating in a rear cavity 216*c* which has therein the bent portion 217*c* of the contact element 214*c* such that a certain degree of rigidity is provided as hereinafter discussed. The other electrical contact of the switch is provided in the form of a similarly contained electrical element 218*c* that terminates in the cavity 215*c* in a contoured section 219*c* such that, upon depression of the push button 197*c*, contact is made between the element 214*c* and the curved portion 219*c*, such that in a normal conventional manner the circuit is closed and current from the converter is transmitted to the ultrasonic motor 50*c*. The rear of the element 218*c* similarly has a curved section 220 which terminates in a pocket on cavity 221*c*. The switch may obviously take many forms and is positioned for ready access between the user's finger when in those instances it is desirable to first obtain the output end of the ultrasonic motor and the member to which the ultrasonic energy is to be transmitted. This permits an easier positionment of the motor tip since, upon energizing, there is immediate movement between the tip end and the work piece; and, accordingly, there are those instances where the switch is desired to be positioned as illustrated in FIGS. 14–18. The electrical coupling means 200*c* as herein described may be encapsulated within the plastic housing in the manufacturing process thereof, such that in actual assembly the motor 50*c* is pre-assembled and need merely be positioned within the housing in a keyed manner. In this manner upon the o-rings being positioned in the seats provided, the electrodes 90*c* and 170*c* are in relative axial position for contact with electrical elements. This is an important feature of this embodiment of the invention in that it permits mass production of ultrasonic motors in a housing where there is no wiring or solder joints on the respective motor or housing, or therebetween.

Once the motor is contained within the housing 52*c*, then the connector 115*c* is positioned within the cavity 60*c* as disclosed and in this embodiment of the invention electrical contacts are provided to engage the respective electrical contacts described above. Accordingly, electrical contact 223*c* meets with electrode 171*c*, contact 224*c* meets with electrode 104*c*, contact 225*c* meets with the element 218*c*, and contact 226*c* meets with 214*c*. In turn, the respective contacts are pre-wired or otherwise molded so that their respective pins of connector 115*c* meet with the connector 120*c* in a conventional manner.

In order to assure proper orientation of connector 115*c* relative to the housing 124*c*, positioning means 230*c* is provided in the form of a keyway or depression 231*c* on the connector 115*c* and a complimentary nib or tooth 232*c* is provided, as seen in FIG. 15, on the casing 124*c*, such that the user may easily orient the connector 115*c* relative to the casing 124*c*.

The connecting pins on the connector 115*c* are wired via 120*c*. Five of such connections are shown in that nut 85*c* similarly has an electrode portion connecting it via element 222*c* partially seen in FIG. 15. Accordingly, the contact 104*c*, through contact 224*c*, is wired to contact 128*c* and in turn to wire 141*c*. Contact 171*c* is wired through 223*c* to contact 191*c* and in turn through wire 192*c*. Contact 222*c* is wired to contact 120*c* and in turn to wire 140*c*. Contact 225*c* is in turn wired to contact 233*c* and in turn wire 198*c*. Contact 226*c* is in turn wired to contact 234*c* and in turn 199*c*. Accordingly, all the wires fit through sleeve 145*c* and are in turn wired to their respected designated positions within the converter.

Figure 20:
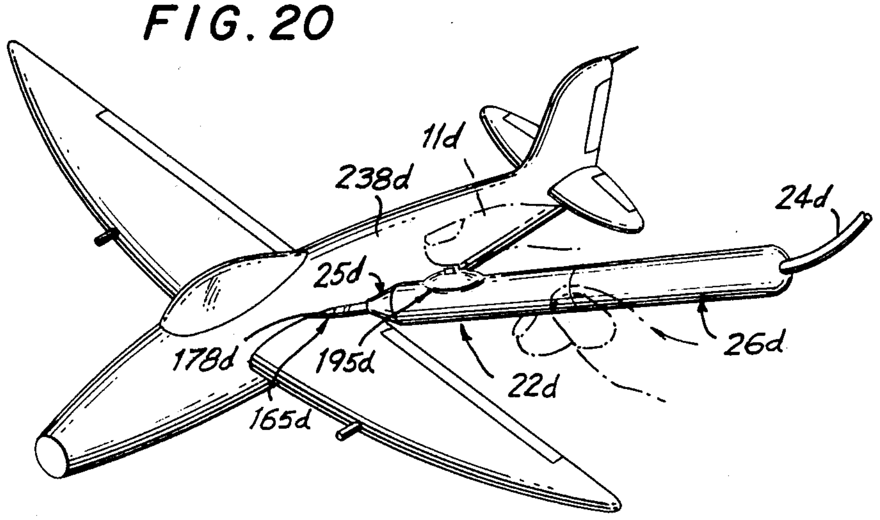
FIG. 20, illustrates the instrument means of the kit used for assembly of a plastic model.
Figure 21:
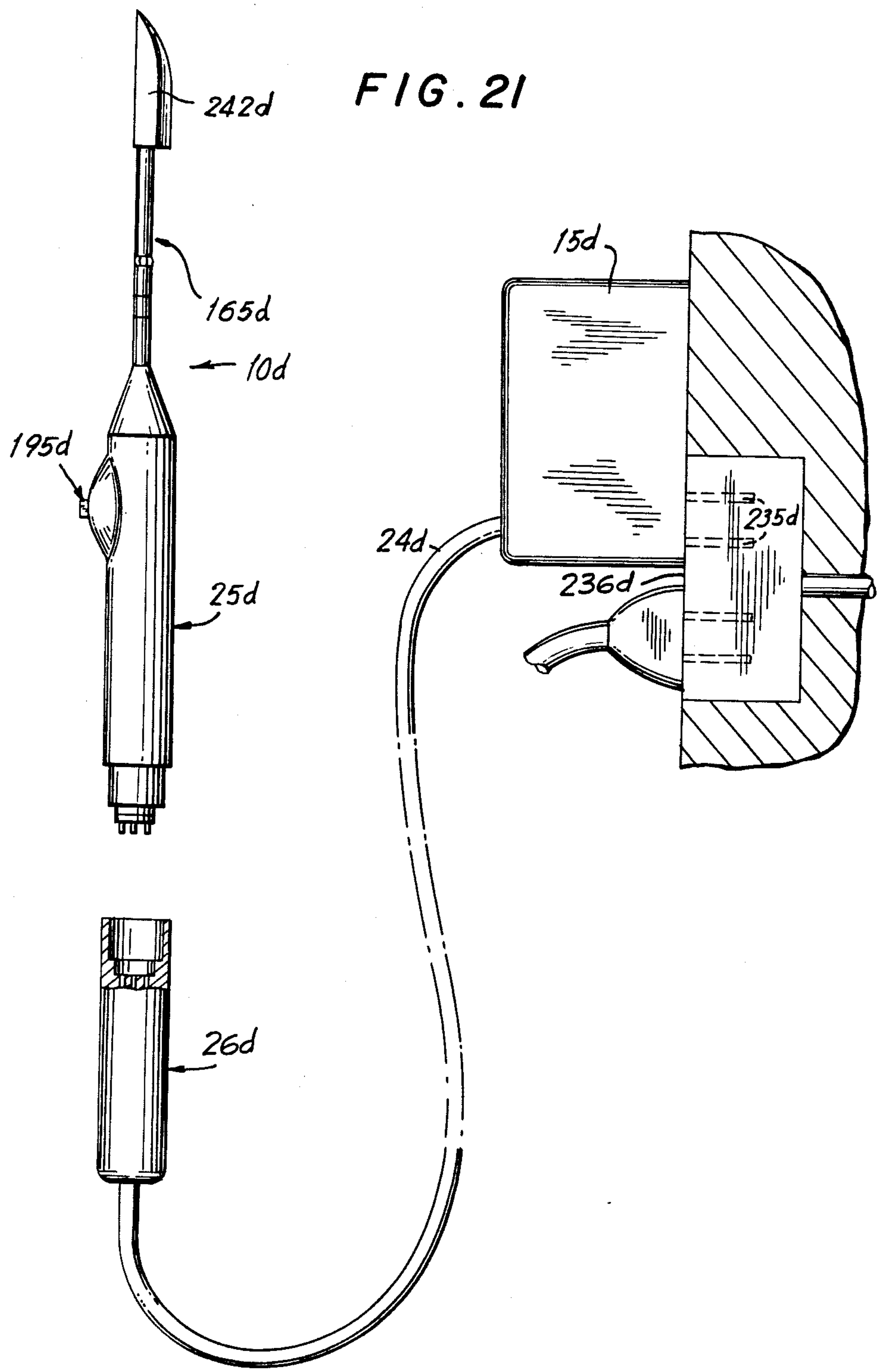
FIG. 21, illustrates an ultrasonic system having a converter adapted to be plugged into a wall outlet.

FIGS. 19–22 illustrate a kit 10*d* that includes instrument means 22*d* with a plurality of interchangeable elements 165*b* adapted to be removably secured to the output section of the accessory 25*d* and having a convertor 15*d* which, as seen in FIG. 21, is of a size in that the male prongs 235*d* will extend outwardly from one edge of the convertor 15*d* and are adapted to be plugged into a wall outlet 236*d*. In this manner the user essentially does not have to position his convertor on a table or other working area but may merely plug into the wall outlet 236*d* the ultrasonic convertor and by means of the cable 24*d* operated by switching means 195*d*, on the accessory 25*d*, may readily perform whatever function he desires. As seen in FIG. 20, we have a model plastic airplane 238*d* that may be included as part of the kit 10*d* such that the user 11*d*, upon purchase of the kit 10*d*, has contained therein one or more models, or other items, to be worked upon utilizing the ultrasonic instrument means 22*d* packaged with the kit.

As seen in FIG. 20, the ultrasonic element 165*b* is interposed between the mating joints of the airplane and by moving same at the joint a flow of plastic occurs which is sufficient to cause a fusion of the plastic parts. The kit 10*d* further includes in its carton or other packaging means 240*d*, with cover 241*d*, a number or removable elements in various shapes and forms. Those illustrated are with a pointed tip element 178*d* as in FIGS. 9 and 10, for use as in FIG. 20 for plastic assembly, a knife element 242*d* as seen in FIG. 21, and a round pointed element 244*d* as seen in use in FIG. 22. Accordingly, the kit is adaptable for use in a great variety of hobby-craft applications and as such a supply of disposable parts 245*d* may be contained in a container 246*d* in the kit 10*d*. The disposable parts 245*d* may be of plastic, metal or other material.

Accordingly, all types of plastic, glass, metal, wood, leather, and other materials may be worked upon with the kit 10*d*. As seen in FIG. 20 the instrument means 22*d* is used by the user 11*d* to assemble a plastic model and control the power by the finger tip switching means 195*d*.

FIG. 21 illustrates the removable element 165*d* in the form of a knife element 242*d*. Accordingly, a number of accessories 25*d* may be purchased by the user, such that even if the elements are removable, the user may have the ones he uses most often already assembled to an accessory 25*d* which is quickly and easily removed from the adapter 26*d*. This type of system gives the user maximum flexibility between interchangeability of the accessory and the removable elements to be used. Further, the convertor 15$d$ is plugged directly into the wall outlet 236$d$ for the convenience of the user.

Figure 22:
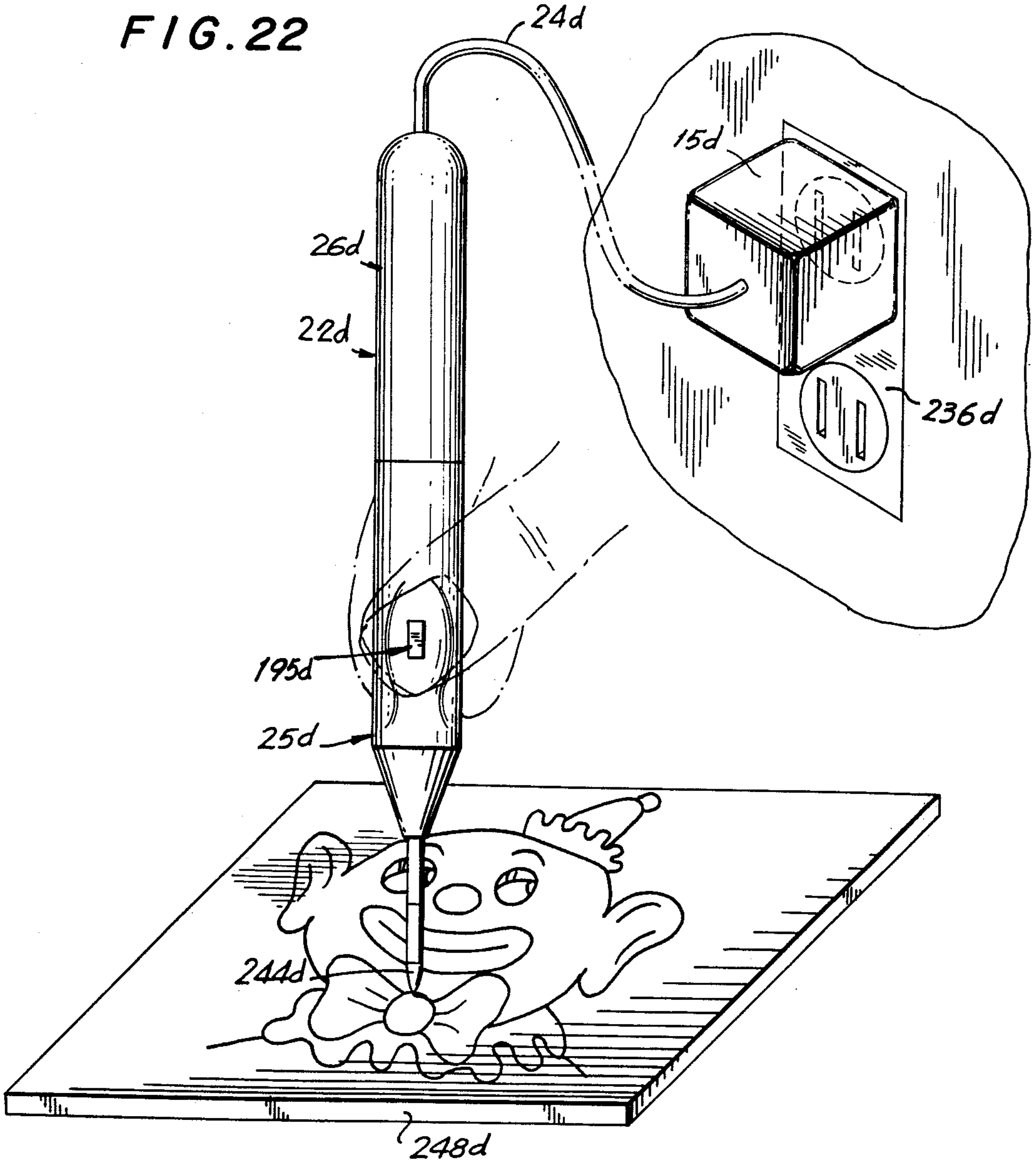
FIG. 22, illustrates the system for use in another hobbycraft.

FIG. 22 illustrates yet another application in which the instrument means 22$d$, connected to the power cable 24$d$ and in turn to the convertor 15$d$, is plugged within the wall outlet 236$d$. In operation the finger switching means 195$d$ is used to vibrate the removable element 244$d$ which is in contact with a wood member 248$d$ such as for wood burning or other applications.

Figure 23:
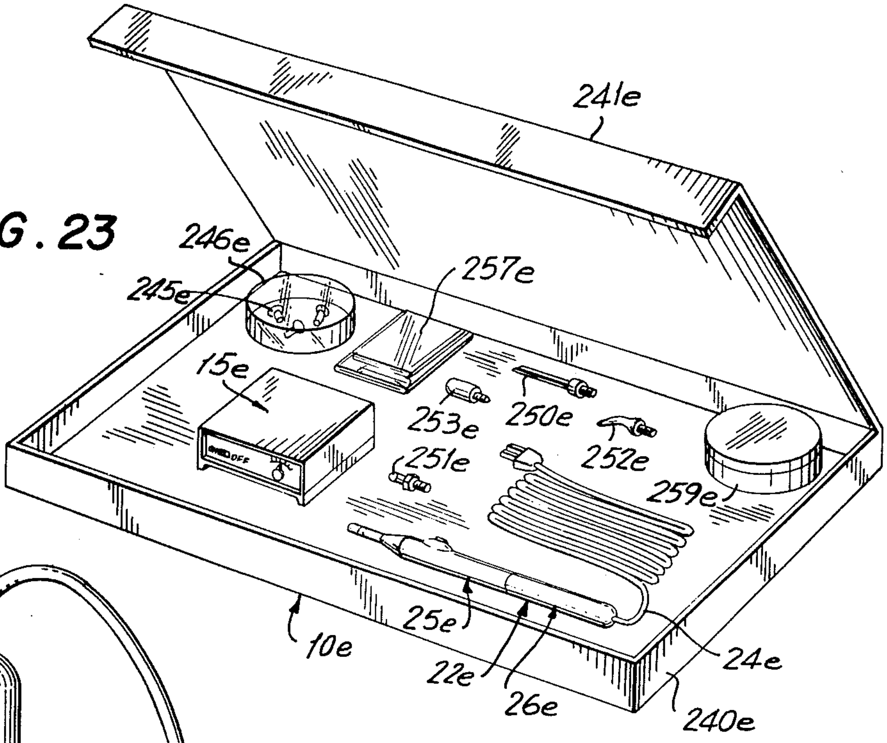
FIG. 23, illustrates another form of hobby kit.
Figure 24:
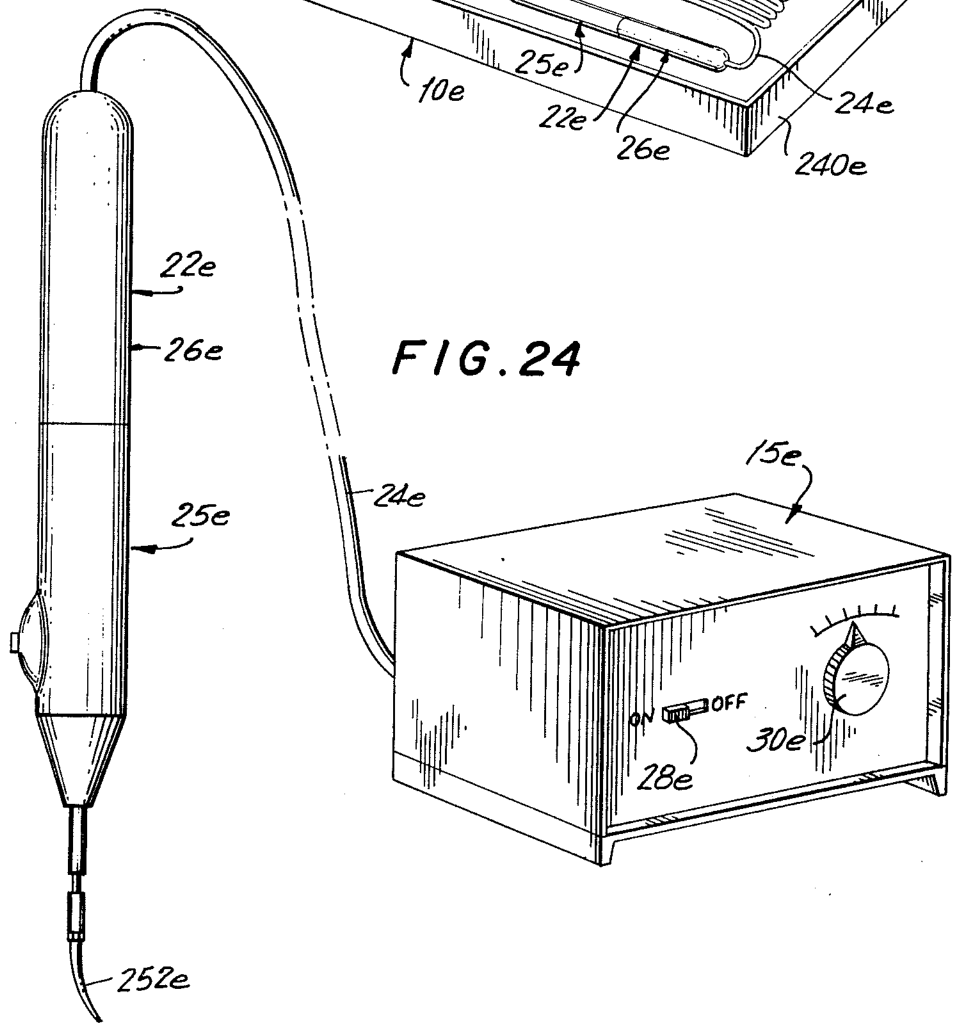
FIG. 24, illustrates the instrument means of the kit in FIG. 23 in assembled relation.

FIGS. 23 and 24 illustrate another form of kit 10$e$ that may be used by the hobbyist to perform a series of applications, some of which are herinafter illustrated in FIGS. 25–28. In contrast to the kit illustrated in FIG. 19, the present kit as seen in FIG. 23 includes a container 15$e$ that could be battery powered or plugged in a wall outlet and having an on/off switch 28$e$ contained on the cabinet as well as a power control adjustment knob 20$e$ such that the power to perform a special application may be properly adjusted by the user 11$e$ as seen in FIG. 25.

The kit includes a convertor 15$e$ contained within packaging means or carton 240$e$ having a cover 241$e$ for shipment. The instrument means 22$e$ is seen to include an adapter 26$e$ having the power cord 24$e$ adapted to be plugged in the convertor 15$e$ as seen in FIG. 24. The accessory 25$e$ is of the type to be removed from the adapter 26$e$ and designed to accept a plurality of interchangeable, removable elements illustrated in the form of a bent or shaped tip 252$e$, an assembly element 253$e$ for use as seen in FIGS. 25-27, an element 251$e$ which may have a rounded tip, the element 250$e$ which may be in the form of a thin spatula for mixing, welding or other applications.

To facilitate the use of the kit 10$e$ by the user, a number of peripheral items may be provided so that the user, upon purchase of the kit, may be able to begin use thereof with what is provided in the kit. For example, the container 246$e$ is provided having a number of clips 245$e$ that may be in the form of plastic or other type fasteners such as illustrated with respect to FIGS. 25–27. In addition, plastic sheet material or even wood members or elements 257$e$ may be provided such as for wood burning or other uses. container 259$e$ is provided for various plastic or leather strips or filaments to be used for artistic craft work or other uses that the hobbyist may find.

It will be noted that a finger switch is also provided on the accessory 25$e$ such that once the user places the power on by switch 28$e$ the convertor may be in the on position such that instaneous power will be available at the removable element 252$e$ upon engagement of the finger switch by the user.

FIGS. 25–28 illustrate further usage of the ultrasonic apparatus. At the present time, erector sets normally utilize metallic nuts and bolts to assemble the respective components thereof. As seen with respect to FIG. 25, metallic components 245$e$ and 255$e$ of the erector set are assembled by using a plastic rivet 256$e$ having its head at one end thereof in a nest 258$e$ and the ultrasonic instrument 22$e$ held by the user 11$e$ with a removable element 253$e$ having a pocket for containment of the shaft of the rivet 256$e$. In this manner the energy is applied with a static force in the direction of the arrow 259$e$, and the kinetic energy imparted to the rivet by the ultrasonic mechanical vibrations effects the flow of the plastic and a head 260$e$ is formed as seen in FIG. 26.

FIGS. 27 and 28 illustrate a novel fastener adapted to be jointed with ultrasonic energy and including a first fastening element or portion 261$e$ having a head portion 262$e$ in a nest 258$e$, and a tubular shaft 263$e$ with an axial bore 268$e$ contained therein and a second fastening element 265$e$ having a head portion 266$e$ and a shaft shank 267$e$ adapted to be contained within the axial bore 268$e$ of the shaft 263$e$. As seen, the two elements 261$e$ and 265$e$ are to be assembled with one head 262$e$ resting in the nest 258$e$ and the second head 266$e$ coupled to the ultrasonic motor tool with ultrasonic vibrations applied thereto by the instrument 22$e$ in the direction of the doubleheaded arrow 269$e$ to assemble parts 254$e$ and 255$e$. The dimensional relationship between the inner bore 268$e$ and the outer diameter of the shaft 267$e$ is such that there is a minimal spacing of 0.0005 inches for the diameters of the shaft 267$e$ in the range of diameter of 0.032 inch to 1 inch such that a flow of the plastic first occurs to form a molecular bond between the respective circular of other cross-sectional areas of the fastening elements 261$e$ and 265$e$.

FIG. 28 shows the removal of a head 266$e$ of a rivet, either as formed in FIGS. 25 and 26, or FIG. 27 with an ultrasonic tool 252$e$ that permits the user to quickly disassemble his erector set by shearing off the heads of the plastic rivets and separate the parts 254$e$ and 255$e$.

Figure 29:
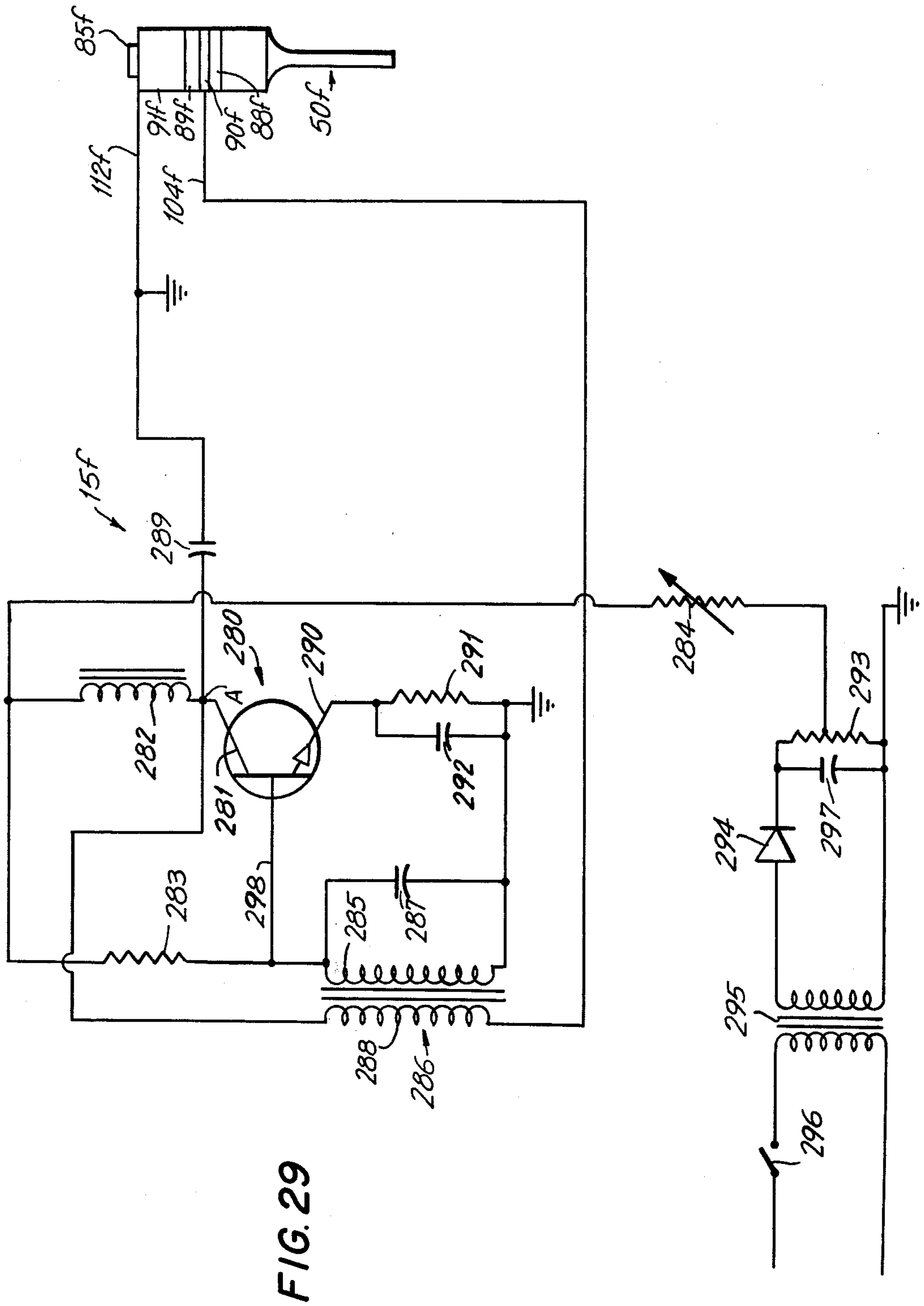
FIGS. 29–32 illustrate various electrical schematics of converters that can be used to drive the various ultrasonic motors described herein.

FIG. 29 illustrates one form of electronic converter circuit 15$f$ that is designed to be used with the type of motor 50$f$ having two crystals 88$f$ and 89$f$ with the electrode 90$f$ therebetween, and generally illustrated in FIGS. 3–6. The motor 50$f$ further includes a rear portion 91$f$ and locking means in the form of a nut 85$f$ with a wire 112$f$ extending from the motor to point of ground or reference potential and a wire 104$f$ extending from the electrode 90$f$ and wired to the converter 15$f$ as hereinafter discussed.

More particularly now, the converter 15$f$ includes a transistor 280 arranged in a driving circuit to provide an output oscillatory signal coupling to the motor 50$f$ to drive or induce ultrasonic vibrations in the piezoelectric crystals 88$f$ and 89$f$. The transistor 280 which is shown as an N-P-N type, has its collector electrode 281 connected through junction terminal A and an R.F. choke 282 to the junction of a fixed value resistor 283 and a variable resistor 284. The other end of the resistor 283 is connected to the base electrode or control terminal 298 of the transistor 280 and one end of a secondary winding 285 of a transformer 286. The other end of the winding 285 is grounded. A capacitor 287 is connected in parallel with the transformer secondary winding 285 to provide a tank circuit resonant at the desired frequency of oscillation. An output coupling of the developed oscillatory signal is via the transformer primary winding 288 connected between the transistor collector electrode 281 (junction terminal A) and the motor driving electrode 90$f$. The collector electrode 281 is coupled to a reference voltage (ground) through an isolating capacitor 289. The emitter electrode 290 of the transistor 280 is coupled to ground through a bias resistor 291. Resistor 291 is bypassed to ground by a capacitor 292.

D.C. operating power for the oscillator may be provided by a standard type half wave rectifier power supply circuit, as shown for example in FIG. 29 as comprising a resistor 293 in series with a diode 294 and connected across the secondary winding of a transformer 295. A filter capacitor 297 is connected across the resistor 293. The transformer primary is connected through a suitable on-off switch 296 to an A.C. voltage source. D.C. voltage is supplied to the oscillator circuit via a lead connection from the variable resistor 284 to a tap on the resistor 293.

Operation of the driving circuit of FIG. 29 is as follows. The variable resistor 284 is adjusted to provide a suitable operating potential for the transistor collector electrode 281. When switch 296 is closed to apply power to the driving circuit, piezoelectric crystals 88*f* and 89*f* start oscillating at the desired frequency and a plurality of harmonic and subharmonic frequencies of said desired frequency. These oscillations are applied through transformer primary winding 286 to the resonant tank formed by capacitor 287 and transformer secondary winding 285. This resonant tank is tuned so as to pass only the desired frequency and to control the operation of transistor 280 at said desired frequency. In this manner, a driving signal is applied to crystals 88*f* and 89*f* to sustain the oscillations thereof and the ultrasonic vibrations of motor 50*f* at the desired frequency. Transistor 280 may operate in a switching mode, being turned "on" and "off" at the desired frequency by the signal passed by the resonant tank circuit. In other words, the conductive path defined by the emitter-collector path of transistor 280 may be rendered conductive and non-conductive at the desired frequency by the control signal applied to base or control terminal 293.

Figure 30:
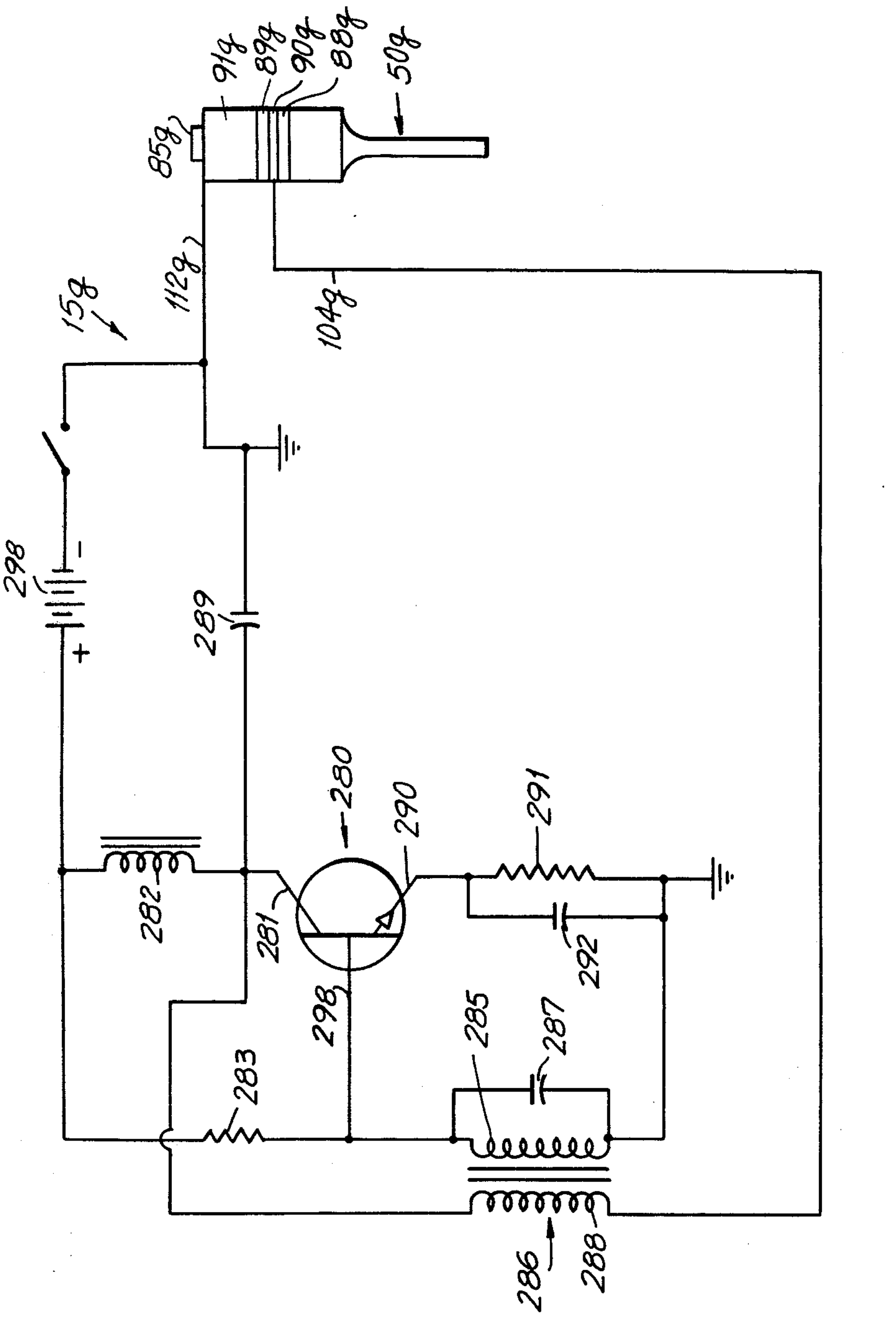

FIG. 30 is similar to FIG. 29 except that in the electronic circuit 15*g* the A.C. to D.C. power supply circuit has been replaced by a battery 298 or straight D.C. power supply.

Figure 31:
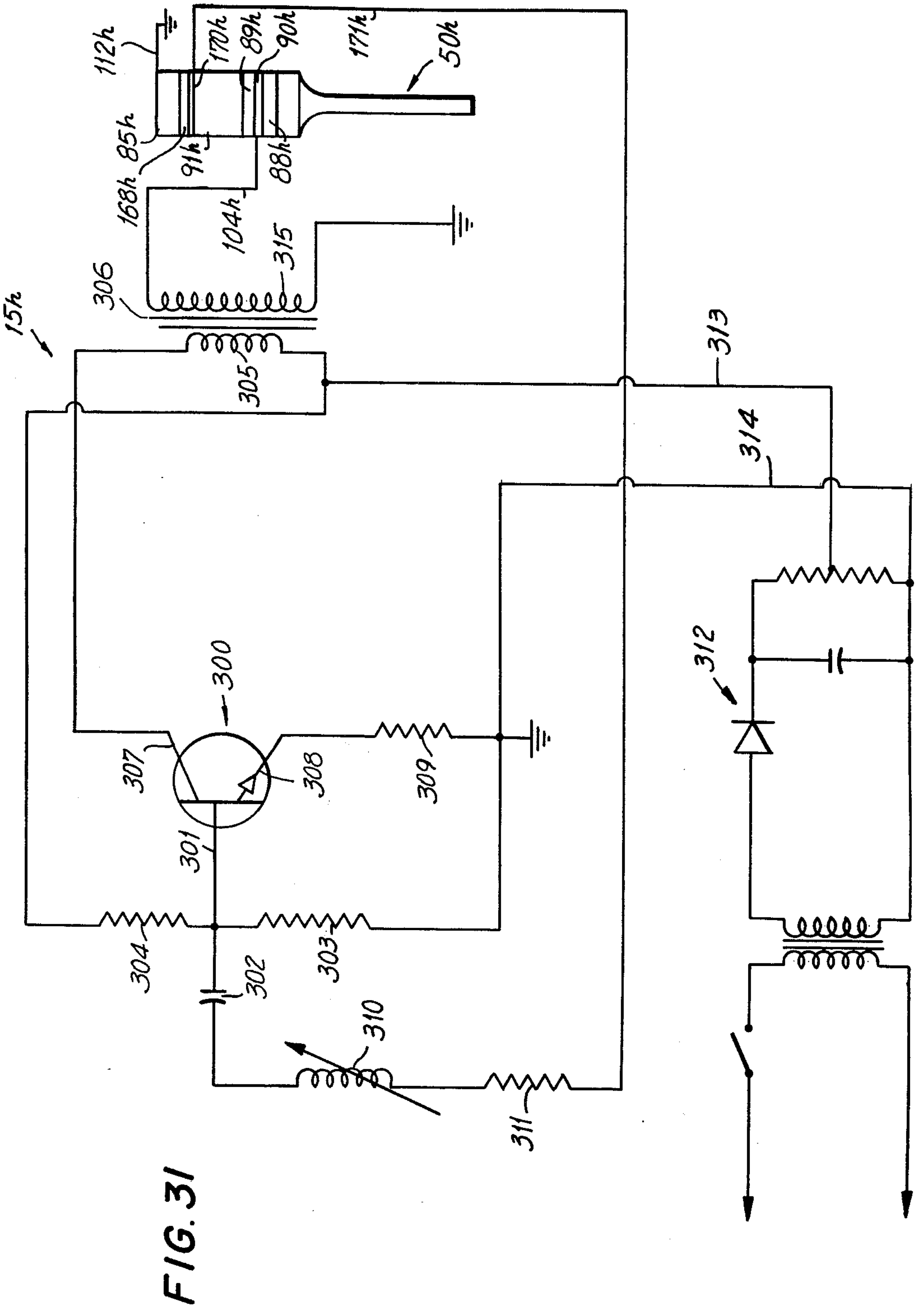

Turning now to FIG. 31, there is illustrated an electronic circuit 15*h* adapted for use with the ultrasonic motor 50*h* which may be of the type illustrated in FIGS. 9–18, inclusive, and which includes a pair of driving crystals 88*h* and 89*h*, with the electrode 90*h* therebetween, with a rear member 91*h* coupled to an electrode 170*h* and a feedback crystal 168*h* with a rear locking nut 85*h*. Electrode 90*h* is connected by wire 104*h* to the circuit and electrode 170*h* by wire 171*h*. The unit is grounded by wire 112*h*.

The oscillator circuit for driving the motor 50*h* includes a transistor 300, having its base electrode central terminal or input 301 connected to the junction of a capacitor 302 and resistors 303 and 304. Resistor 304 is returned via the primary winding 305 of a transformer 306 to the collector electrode 307 of the transistor 300. The emitter electrode 308 of the transistor 300 is connected to a reference voltage (ground) through a resistor 309. The emitter collector path of transistor 300 defines a conductive path. The other end of resistor 303 is also connected to reference voltage. The capacitor 302 is series connected to a variable inductor 310 which is tuned with the capacitor 302 to be series resonant at the desired frequency of vibration for the motor driving crystal 90*h*. A signal attenuating resistor means 311 series connects the inductor 310 to a feedback crystal 170*h* in the motor 50*h*. Operating potential for the circuit is supplied from an A.C. to D.C. power supply 312, similar to that shown in FIG. 29. Connection of the power supply D.C. output voltage to the oscillator circuit is via lead 313 to the transformer primary winding 305 and ground lead 314. The oscillatory output drive signal is coupled to the motor 50*h* and electrode 90*h* via the transformer secondary winding 305.

Operation of the circuit is as follows:

When the circuit 15*h* is energized, as by closing of the power supply on-off switch, the sudden surge of current therefrom will drive the crystals 88*h* and 89*h* into a vibratory mode of operation. The vibrations of crystal 88*h* and 89*h* will in turn induce vibrations in the feedback crystal 168*h* and the vibrations or oscillatory output of crystal 168*h* is fed back to the base input of the transistor 300 via the inductor 310 and capacitor 312 network. Since the induced vibrations in the crystal may be harmonic and or subharmonic of the crystal fundamental frequency, the inductor-capacitor feedback network is tuned to be series resonant at the desired frequency of vibration for the motor 50*h*. The transistor 300 operates as an amplifier so that at this series resonant frequency, the feedback signal to the base input of the transistor 300 will be at a level to provide a sufficient signal output from the transistor 300 for coupling via the transformer 306 to the crystals 88*h* and 89*h* to sustain the crystal vibrations at the desired or tuned frequency of the series resonant circuit. The amplifier defined by transistor 300 is referred to herein as an "untuned amplifier circuit" since, as is apparent from a consideration of the foregoing and FIG. 31, the load circuit of said amplifier is free of a tuned circuit. The load circuit of said transistor amplifier consists of transformer 306 and crystals 88*h* and 89*h* and is operatively coupled to the output of the transistor amplifier.

Figure 32:
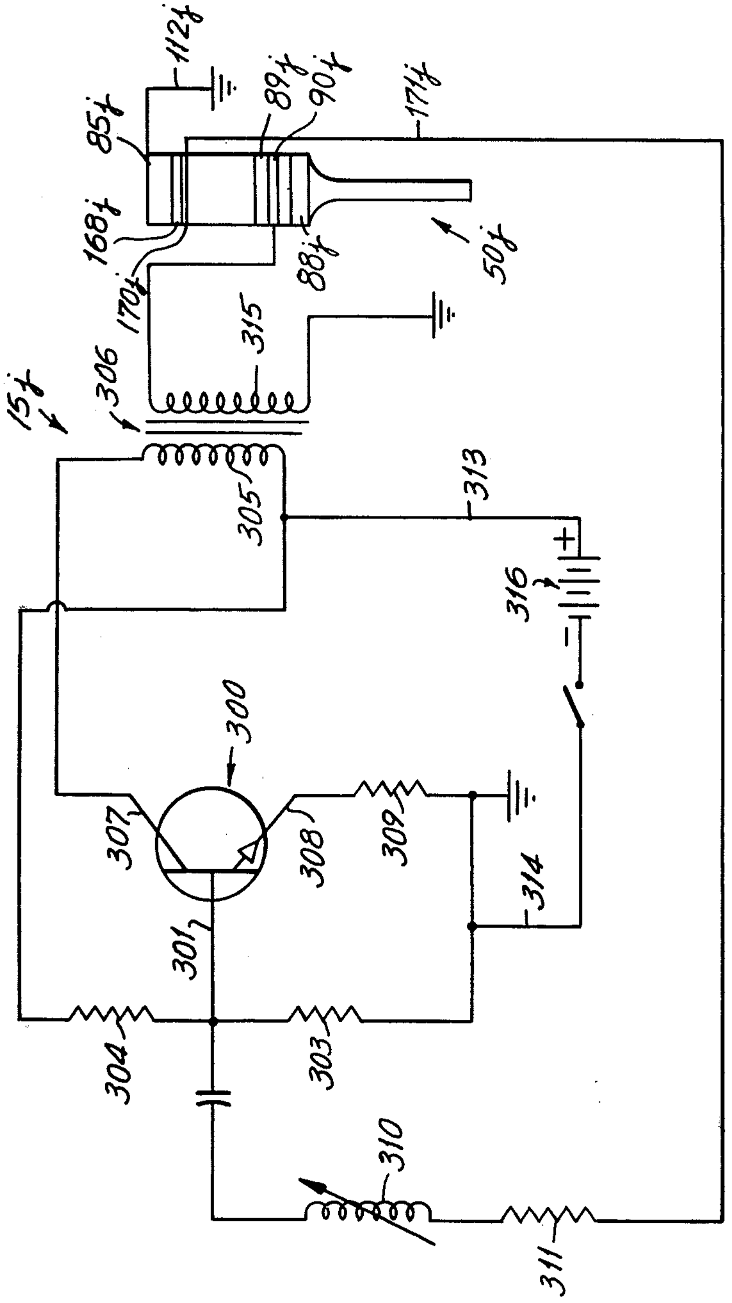

FIG. 32 is similar to FIG. 31 except that in the circuit 16*j* the A.C. to D.C. power supply circuit has been replaced by a battery 316. Operation of the circuit is the same as was heretofore described with respect to FIG. 31.

Figure 33:
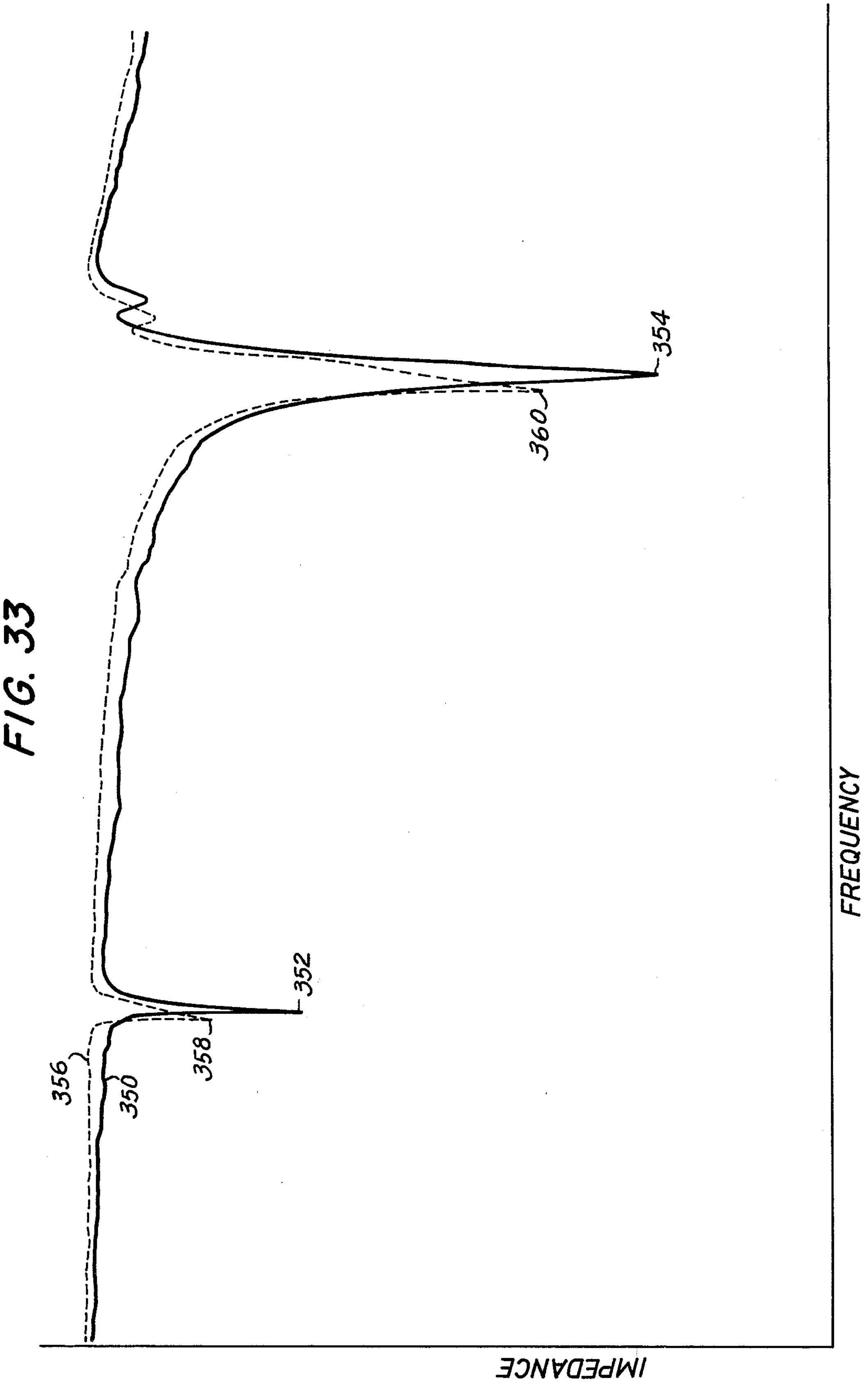
FIG. 33 is a graphical plot of impedance vs. frequency for a loaded and unloaded motor.

The ultrasonic motors in accordance with the invention are capable of vibration at a plurality of frequencies representative of various harmonic and subharmonic frequencies, as well as various characteristic vibration frequencies of the piezoelectric crystals of said motor. By way of example, reference is had to FIG. 33 which depicts a graphical representation of a plot of impedance vs. frequency for an ultrasonic motor. The plot 350, in solid lines, represents the characteristic of the motor at no-load, showing oscillatory conditions at peaks 352 and 354. At load conditions represented by plot 356 (dashed lines), the peak conditions 358 and 360, also characteristic of maximum current output are shifted in frequency and are of reduced magnitude. In the preferred embodiments, the tuned circuits, formed of transformer secondary winding 285 and capacitor 287 of the embodiments of FIG. 29 and 30 and inductor 310 and capacitor 302 of the embodiments of FIGS. 31 and 32, define band-pass filters having a band width sufficiently wide to encompass not only the desired frequency at no-load condition, but also the desired frequency at load condition despite the characteristic shift in such frequency. As used herein, the term "desired frequency" refers to the desired frequency under the particular operating conditions including a variety of load conditions. In the absence of the tuned circuit portion of the driving circuit in accordance with the invention, under various load conditions the motor might vibrate at other than the desired frequency, selecting one of the other resonant frequencies at which it is capable of vibrating.

The tuned circuit in accordance with the invention also permits the use of the driving circuit with a plurality of different motors without fine tuning, provided each of the motors has a desired frequency within the selected band. This feature also permits the standardization of the circuitry for use in conjunction with mass produced motors which might have minor differences in their respective desired resonant frequency.

While the circuits of FIGS. 31 and 32 are shown connected to a motor having separate piezoelectric and sensing piezoelectric crystals, said circuit can be connected to a single piezoelectric crystal having separate driving and sensing electrodes mounted thereon such as the tubular crystal depicted in FIG. 21 of our application Ser. No. 209,971, filed Dec. 20, 1971, for "Ultrasonic Dental and Other Instrument Means and Methods," which has been incorporated herein as if fully set forth. Further, the circuits of FIGS. 29–32 may be modified as taught in our co-pending application Ser. No. 318,428, filed Dec. 26, 1972, for "Ultrasonic Motor-Converter Systems," which has been incorporated herein as if fully set forth, so that the output of the motor consists of bursts of ultrasonic vibrations repeated at a sonic frequency.

It will thus be seen that the objects set forth above, and those made apparent from the preceding description, are efficiently attained and, certain changes may be made in the above constructions without departing from the spirit and scope of the invention, it is intended that all matter contained In the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A driving circuit for driving an ultrasonic transducer having a piezoelectric element, said transducer being capable of vibration at a plurality of frequencies including a desired frequency, comprising:

A. a power supply for producing a power signal;

B. a reference voltage;

C. a single transistor means having a conductive path coupled intermediate said power supply and a reference voltage and further having a control terminal, a control signal applied to said control terminal controlling the conductivity of said conductive path and therefore controlling the application of said power signal to said piezoelectric element as a driving signal, said conductive path of said transistor means being coupled to said power supply at a junction terminal;

D. transformer means having a primary winding and a secondary winding, said primary winding being electrically coupled intermediate said junction terminal and said piezoelectric element for detecting a detected signal representative at least of the frequency of said driving signal; and E. tuned circuit means tuned to said desired frequency and formed from inductor means, and capacitor means connected in parallel with said inductor means, said transformer means secondary winding defining said inductor means, said tuned circuit means being operatively coupled between said transistor means control terminal and said reference voltage for applying a control signal to said control terminal for controlling the conductivity of said conductive path at said desired frequency in response to said detected signal to produce said driving signal at said desired frequency.

2. A driving circuit as defined in claim 1, wherein said transistor means includes an emitter, collector, and base, said conductive path being defined by the emitter-collector path of said transistor means, said control terminal being defined by the base of said transistor means.

3. A driving circuit as defined in claim 1, wherein said power supply produces an essentially D.C. power signal

4. A driving circuit as defined in claim 1, wherein said transducer has a desired frequency of vibration at each of load and no-load conditions, said tuned circuit means being tuned to a band of frequencies including both said load and no-load desired frequencies so that the vibration of said transducer is sustained at both load and no-load conditions.

5. An ultrasonic system, comprising:

A. an ultrasonic motor having an output portion for transmission of high frequency mechanical vibrations said motor being capable of vibration at a plurality of frequencies, including a desired frequency;

B. driving circuit means operatively coupled to said ultrasonic motor for applying thereto a driving signal of said desired frequency for sustaining the vibration of said motor at said frequency, said driving circuit means including:

1. a power supply for producing a power signal;
2. a reference voltage;
3. a single transistor means having a conductive path coupled intermediate said power supply and a reference voltage and further having a control terminal, a control signal applied to said control terminal controlling the conductivity of said conductive path and therefore controlling the application of said power signal to said ultrasonic motor as said driving signal, said conductive path of said transistor means being coupled to said power supply at a junction terminal;

C. transformer means having a primary winding and a secondary winding, said primary winding being electrically coupled intermediate said junction terminal and said ultrasonic motor for detecting a detected signal representative at least of the frequency of said driving signal; and D. tuned circuit means tuned to said desired frequency and formed from inductor means, and capacitor means connected in parallel with said inductor means, said transformer means secondary winding defining said inductor means, said tuned circuit means being operatively coupled between said transistor means control terminal and said reference voltage for applying a control signal to said control terminal for controlling the conductivity of said conductive path at said desired frequency in response to said detected signal to produce said driving signal of said desired frequency.

6. The system as defined in claim 5, wherein said ultrasonic motor includes a piezoelectric transducer means, said transformer primary being electrically connected between said junction terminal and said piezoelectric transducer means.

7. The system as defined in claim 5, wherein said transistor means has an emitter, collector and base, the emitter-collector path of said transistor means defining said conductive path, said base defining said control terminal.

8. The system of claim 5, wherein said power supply includes rectifier means for producing an essentially D.C. power signal.

9. The system as defined in claim 5, wherein said power supply includes a battery for producing a D.C. power signal.

10. The system as defined in claim 5, wherein said tuned circuit means is tuned to a band of frequencies.

11. The system as defined in claim 9, wherein said ultrasonic motor has a desired frequency of vibration at each of load and no-load conditions, said tuned circuit means band of frequencies including both said load and no-load desired frequencies so that the vibration of said motor is sustained at both load and no-load conditions.

12. The system as defined in claim 5, wherein said system includes:

A. adapter means having first electrical and mechanical connector means mounted thereon;
B. cable means for electrically connecting said driving circuit means and said first electrical connector means; and
C. accessory means including;
   1. a housing having an outlet opening, said ultrasonic motor being mounted within said housing with the output portion thereof extending through said outlet opening;
   2. second electrical and mechanical connector means mounted on said housing and adapted to be releasably connected to said first electrical and mechanical connector means for the mechanical coupling of said housing and adapter means and the transmission of electrical energy therebetween; and
   3. means within said housing for electrically connecting said second electrical connector means and said ultrasonic motor.

13. An ultrasonic system as defined in claim 5, including:

A. housing means formed with an outlet opening and a cable aperture, said ultrasonic motor being mounted within said housing means with said output portion extending through said housing means outlet opening, said housing means and ultrasonic motor defining an instrument means adapted to be hand held by the user;
B. cable means passing through said housing means cable aperture and electrically interconnecting said driving circuit means and said ultrasonic motor; and
C. interchangeable means each adapted to be removably secured to the outlet portion of said ultrasonic motor to permit a variety of applications of ultrasonic mechanical vibrations to selected objects for various results.

14. An ultrasonic system as defined in claim 5, including electrical plug means for connection to an electrical outlet, said driving circuit means being mounted in said plug means.

15. The system as defined in claim 5, wherein said ultrasonic motor output portion has a rear section and a front section, said front section having a smaller cross-sectional area than said rear section to act as an acoustical impedance transformer to amplify the mechanical vibrations transmitted to said rear section for transmission by said front section, said ultrasonic motor including support means extending longitudinally from said output portion rear section, said piezoelectric transducer means being positioned on said support means, said ultrasonic motor further including a rear member mounted in telescopic relation to said transducer means on said support means, and locking means for maintaining said output portion, transducer means and rear member under compression.

16. An ultrasonic system, comprising:

A. an ultrasonic motor having an output portion for transmission of high frequency mechanical vibrations, said motor being capable of vibration at a plurality of frequencies including a desired frequency; and
B. driving circuit means operatively coupled to said ultrasonic motor for applying thereto a driving signal of said desired frequency for sustaining the vibration of said motor at said frequency, said driving circuit means including:
   1. transistor amplifier circuit means for producing said driving signal having an input and an output;
   2. a load circuit operatively coupled to said amplifier circuit means output, said load circuit being free of a tuned circuit and including said ultrasonic motor for the application of said driving signal to said ultrasonic motor;
   3. tuned circuit means tuned to said desired frequency for defining a filter means and coupled to said amplifier circuit means input; and
   4. sensing means mechanically coupled to said ultrasonic motor for detecting the frequencies of vibration thereof and producing a detected signal representative of the frequencies of vibration of said ultrasonic motor and electrically coupled to said tuned circuit means for applying said detected signal thereto, said tuned circuit means passing only the desired frequency portion of said detected signal to said amplifier circuit means input, said amplifier circuit means amplifying said filtered signal to produce a driving signal of said desired frequency.

17. The system as defined in claim 16, wherein said driving circuit means includes a power supply for producing a power signal; said amplifier circuit means input controlling the application of said power signal to said ultrasonic motor as said driving signal.

18. The system of claim 16, wherein said power supply includes rectifier means for producing an essentially D.C. power signal.

19. The system as defined in claim 16, wherein said power supply includes a battery for producing a D.C. power signal.

20. The system as defined in claim 16, wherein said tuned circuit means includes capacitor means and inductor means connected in series.

21. The system as defined in claim 16, wherein said driving circuit means includes a power supply operatively coupled to said amplifier means, said power supply including rectifier means for producing an essentially D.C. power signal for said amplifer means.

22. The system as defined in claim 16, wherein said driving circuit means includes a power supply operatively coupled to said amplifier means, said power supply including a battery for supplying a D.C. power signal for said amplifier means.

23. The system as defined in claim 16, wherein said amplifer means includes transistor means having an emitter, collector, and base, said tuned circuit means being operatively coupled to said base, said driving circuit means including a power supply and connecting circuit means operatively connecting said power supply, the emitter-collector path of said transistor means and said load circuit.

24. The system as defined in claim 16, wherein said sensing means is a piezoelectric sensing member mechanically coupled to said motor output portion.

25. The system as defined in claim 24, wherein said ultrasonic motor includes a piezoelectric transducer means electrically connected to said driving circuit means for receiving said driving signal therefrom.

26. The system as defined in claim 25, wherein said motor output portion has a rear section and a front section, said front section having a smaller cross-sectional area than said rear section to act as an acoustical impedance transformer to amplify the mechanical vibrations applied thereto for transmission by said front section, said ultrasonic motor including support means extending longitudinally from said rear section, said piezoelectric transducer means being positioned on said support means, said ultrasonic motor further including a rear member mounted in telescopic relation to said transducer means and locking means for maintaining said output portion, said transducer means and said rear member being under compression.

27. The system as defined in claim 26, wherein said piezoelectric sensing member is mounted in telescopic relation to said rear member on said support means, said locking means maintaining said output portion, transducer means, sensing member and rear member under compression.

28. The system as defined in claim 16, wherein said ultrasonic motor includes a piezoelectric transducer means having sensing electrodes and driving electrodes, said driving electrodes being connected to said driving circuit means for receiving said driving signal therefrom, said sensing electrodes defining said sensing means.

29. The system as defined in claim 16, wherein said tuned circuit means is tuned to a band of frequencies.

30. The system as defined in claim 24, wherein said ultrasonic motor has a desired frequency of vibration at each of load and no-load conditions, said tuned circuit means band of frequencies including both said load and no-load desired frequencies so that the vibration of said motor is sustained at both load and no-load conditions.

31. The system as defined in claim 16, wherein said system includes:

A. adapter means having first electrical and mechanical connector means mounted thereon;

B. cable means for electrically connecting said driving circuit means and said first electrical connector means; and C. accessory means including:

1. a housing having an outlet opening, said ultrasonic motor being mounted within said housing with the output portion thereof extending through said outlet opening;
2. second electrical and mechanical connector means mounted on said housing and adapted to be releasably connected to said first electrical and mechanical connector means for the mechanical coupling of said housing and adapter means and the transmission of electrical energy therebetween; and
3. means within said housing for electrically connecting said second electrical connector means and said ultrasonic motor.

32. An ultrasonic system as defined in claim 16, including:

A. housing means formed with an outlet opening and a cable aperture, said ultrasonic motor being mounted within said housing means with said output portion extending through said housing means outlet opening, said housing means and ultrasonic motor defining an instrument means adapted to be hand held by the user;

B. cable means passing through said housing means cable aperture and electrically interconnecting said driving circuit means and said ultrasonic motor; and C. interchangeable means each adapted to be removably secured to the outlet portion of said ultrasonic motor to permit a variety of applications of ultrasonic mechanical vibrations to selected objects for various results.

33. An ultrasonic system as defined in claim 16, including electrical plug means for connection to an electrical outlet, said driving circuit means being mounted in said plug means.

34. A driving circuit for driving an ultrasonic transducer having a piezoelectric element, said transducer being capable of vibration at a plurality of frequencies including a desired frequency comprising:

A. sensing means mechanically coupled to said ultrasonic transducer for detecting the frequencies of vibration thereof and producing a detected signal representative of said frequencies of vibration;

B. transistor amplifier means having an input and an output;

C. tuned circuit means tuned to said desired frequency and electrically connected intermediate said sensing means and said amplifier means input, said tuned circuit means being adapted to filter said detected signal and pass to said amplifier means input the component of said detected signal of said desired frequency; and D. load circuit means free of a tuned circuit operatively connecting said amplifier means output and said piezoelectric element for applying a driving signal to said piezoelectric element of said desired frequency.

35. The driving circuit as defined in claim 34, wherein said tuned circuit means includes capacitor means and inductor means connected in series, said sensing means being a piezoelectric sensing member mechanically coupled to said ultrasonic transducer.

36. A driving circuit as defined in claim 34, wherein said transducer has a desired frequency of vibration at each of load and no-load conditions, said tuned circuit means being tuned to a band of frequencies including both said load and no-load desired frequencies so that the vibration of said motor is sustained at both load and no-load conditions.

37. A driving circuit for driving an ultrasonic transducer having a piezoelectric element, said transducer being capable of vibration at a plurality of frequencies including a desired frequency comprising:

A. sensing means mechanically coupled to said ultrasonic transducer for detecting the frequencies of vibration thereof and producing a detected signal representative of said frequencies of vibration;

B. amplifier means including a transistor means having a conductive path and a control terminal, the signal applied to said control terminal being amplified in said conductive path;

C. tuned circuit means tuned to said desired frequency and electrically connected intermediate said sensing means and said transistor means control terminal, said tuned circuit means being adapted to filter said detected signal and pass to said transistor means control terminal the component of the detected signal of said desired frequency for amplification by said transistor means;

D. a power supply; and

E. load circuit means free of a tuned circuit operatively connecting said transistor means conductive path and said piezoelectric element for applying a driving signal to said piezoelectric element of said desired frequency, said load circuit means including a transformer having a primary winding connected in series with said power supply and said transistor means conductive path and a secondary winding electrically connected to said piezoelectric element, whereby the amplified component of said detected signal of said desired frequency is applied as a driving signal to said piezoelectric element.

38. An ultrasonic system, comprising:

A. an ultrasonic motor having an output portion for transmission of high frequency mechanical vibrations, said motor being capable of vibration at a plurality of frequencies including a desired frequency; and B. driving circuit means operatively coupled to said ultrasonic motor for applying thereto a driving signal of said desired frequency for sustaining the vibration of said motor at said frequency, said driving circuit means including:

1. amplifier circuit means having a transistor means including a conductive path and a control electrode;
2. sensing means mechanically coupled to said ultrasonic motor for detecting the frequencies of vibration thereof and producing a detected signal representative of the frequencies of vibration of said ultrasonic motor;
3. tuned circuit means tuned to said desired frequency and electrically connected intermediate said sensing means and said transistor means control electrode, said tuned circuit means being adapted to filter said detected signal and pass to said transistor means control electrode the component of said detected signal of said desired frequency, said transistor means amplifying said detected signal, the amplified detected signal appearing in said conductive path;
4. a power supply for supplying a power signal; and
5. load circuit means free of a tuned circuit operatively connecting said transistor means conductive path, power supply, and said ultrasonic motor including a transformer having a primary winding electrically connected in series with said power supply and said transistor means conductive path and a secondary winding electrically connected to said ultrasonic motor, whereby said motor is driven by said amplified detected signal.

* * * * *